(12) United States Patent
Shimomura

(10) Patent No.: US 8,338,218 B2
(45) Date of Patent: Dec. 25, 2012

(54) PHOTOELECTRIC CONVERSION DEVICE MODULE AND MANUFACTURING METHOD OF THE PHOTOELECTRIC CONVERSION DEVICE MODULE

(75) Inventor: Akihisa Shimomura, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 591 days.

(21) Appl. No.: 12/482,086

(22) Filed: Jun. 10, 2009

(65) Prior Publication Data

US 2009/0320897 A1 Dec. 31, 2009

(30) Foreign Application Priority Data

Jun. 26, 2008 (JP) ................. 2008-166681

(51) Int. Cl.
*H01L 21/30* (2006.01)

(52) U.S. Cl. .................. 438/73; 438/80; 257/E21.211; 257/E21.212; 136/252

(58) Field of Classification Search .............. 438/66–69, 438/71, 73, 74, 80; 257/E21.212
See application file for complete search history.

(56) References Cited

U.S. PATENT DOCUMENTS

| | | |
|---|---|---|
| 4,281,208 A | 7/1981 | Kuwano et al. |
| 4,316,049 A | 2/1982 | Hanak |
| 4,496,788 A | 1/1985 | Hamakawa et al. |
| 4,879,251 A | 11/1989 | Kruehler et al. |
| 5,259,891 A | 11/1993 | Matsuyama et al. |
| 5,371,037 A | 12/1994 | Yonehara |
| 5,665,607 A | 9/1997 | Kawama et al. |
| 5,736,431 A | 4/1998 | Shinohara et al. |
| 5,750,000 A | 5/1998 | Yonehara et al. |
| 5,840,616 A | 11/1998 | Sakaguchi et al. |
| 5,854,123 A | 12/1998 | Sato et al. |
| 6,372,609 B1 | 4/2002 | Aga et al. |
| 6,380,046 B1 | 4/2002 | Yamazaki |
| 6,384,318 B1 | 5/2002 | Nomura |
| 6,452,089 B1 | 9/2002 | Kubota |
| 6,534,380 B1 | 3/2003 | Yamauchi et al. |
| 6,566,277 B1 | 5/2003 | Nakagawa et al. |
| 6,692,981 B2 | 2/2004 | Takato et al. |
| 6,818,529 B2 | 11/2004 | Bachrach et al. |
| 2008/0099065 A1 | 5/2008 | Ito et al. |
| 2009/0127555 A1 | 5/2009 | Yamazaki et al. |

(Continued)

FOREIGN PATENT DOCUMENTS

JP 06-044638 6/1994

(Continued)

*Primary Examiner* — David Vu
*Assistant Examiner* — Earl Taylor
(74) *Attorney, Agent, or Firm* — Fish & Richardson P.C.

(57) ABSTRACT

A manufacturing method of a photoelectric conversion device module, wherein an insulating layer and a first electrode are formed over a base substrate; a plurality of single-crystal semiconductor substrates having a first conductivity type including embrittlement layers formed inside are attached; the plurality of single-crystal semiconductor substrates are separated at the embrittlement layers so that a plurality of stacked bodies including the insulating layer, the first electrode and a first single-crystal semiconductor layer is formed; a second single-crystal semiconductor layer is formed over the stacked bodies to form a first photoelectric conversion layer; a second photoelectric conversion layer including a non-single-crystal semiconductor layer is formed; a second electrode is formed; and selective etching is conducted to form photoelectric conversion cells which are element-separated, and a connecting electrode is formed to connect the second electrode of one photoelectric conversion cell and the first electrode of the other photoelectric conversion cell.

19 Claims, 19 Drawing Sheets

U.S. PATENT DOCUMENTS

| | | |
|---|---|---|
| 2009/0142879 A1 | 6/2009 | Isaka et al. |
| 2009/0142908 A1 | 6/2009 | Isaka et al. |
| 2009/0305469 A1 | 12/2009 | Kato et al. |

FOREIGN PATENT DOCUMENTS

| | | |
|---|---|---|
| JP | 10-093122 | 4/1998 |
| JP | 10-093122 A | 4/1998 |
| JP | 10-335683 | 12/1998 |
| JP | 10-335683 A | 12/1998 |
| JP | 11-097379 | 4/1999 |
| JP | 11-163363 | 6/1999 |
| JP | 2000-150940 | 5/2000 |
| JP | 2002-348198 | 12/2002 |
| JP | 2005-038907 | 2/2005 |
| JP | 2005-268682 A | 9/2005 |

PHOTOELECTRIC CONVERSION DEVICE MODULE AND MANUFACTURING METHOD OF THE PHOTOELECTRIC CONVERSION DEVICE MODULE

BACKGROUND OF THE INVENTION

1. Field of the Invention

The present invention relates to a photoelectric conversion device module including a plurality of photoelectric conversion devices on one substrate and a manufacturing method of the photoelectric conversion device module.

2. Description of the Related Art

The progress of global warming is serious and there is a demand for clean energy. Photoelectric conversion devices typified by solar cells are thought to be typical of the next generation energy, and recent research and development has been extremely actively made and the market for solar cells are rapidly expanding.

Solar light which is an energy source of a photoelectric conversion device is inexhaustible, available for free, has a possibility to contribute to reduction of carbon-dioxide emissions, and thus is very attractive. However, such a photoelectric conversion device using solar light cannot achieve sufficient efficiency of photoelectric conversion and has a dependency on daylight hours. Thus, the commercial cost of such devices is not lowered, which hinders widespread utilization. Thus, high efficiency and low cost of such photoelectric devices are demanded.

Such photoelectric conversion devices can be formed using a silicon-based material or a compound-based material, and silicon-based solar cells such as bulk type crystal silicon solar cells and thin film type silicon solar cells are mainly commercialized. Such bulk type single-crystal silicon solar cells can achieve high efficiency but are disadvantageous in the consumption amount of resources and manufacturing cost because they are formed from single-crystal silicon substrates. In addition, such bulk type single-crystal silicon solar cells are difficult to be enlarged, because they depend on the size of a single-crystal silicon substrate. On the other hand, thin film type silicon solar cells are formed using silicon thin films formed by a CVD method or the like and thus can achieve resource saving, enlargement in area and reduction of manufacturing cost, but cannot achieve sufficient photoelectric conversion efficiency.

In order to keep high photoelectric efficiency and achieve low cost and resource saving, a method for manufacturing a solar cell is proposed in which hydrogen ions are implanted into a crystalline semiconductor and the crystalline semiconductor is cut by heat treatment to obtain a crystalline semiconductor layer (for example, see Patent Document 1). After a crystalline semiconductor in which ions of a predetermined element are implanted in a layered manner is attached to a surface of electrode-forming paste applied over a substrate provided with an insulating layer, heat treatment is performed at 300° C. to 500° C. to bond the crystalline semiconductor to an electrode. Next, by heat treatment at 500° C. to 700° C., voids distributed in a layered manner are formed in a region of the predetermined element implanted into the crystalline semiconductor, and further, the crystalline semiconductor is divided at the voids by heat distortion. Accordingly, a crystalline semiconductor layer over the electrode is obtained.

Further, in order to efficiently utilize solar light having a wide spectrum, solar cells having a multilayer unit cell structure have been researched for a long time. For example, Patent Document 2 proposes a stack type solar cell with different type unit cells in which an amorphous unit cell is stacked on a crystalline unit cell.

Further, in order to utilize photovoltaic power generation for housing or commercial use, electromotive force generated by a single photoelectric conversion device is not sufficient, and thus there is a need to connect a plurality of photoelectric generation devices (photoelectric conversion cells) in series or in parallel to make a module. For example, a photoelectric conversion device is known, in which a multilayered body in which a photoelectric conversion unit including hydrogenated amorphous silicon and a photoelectric conversion unit including crystalline silicon are stacked is formed on a translucent substrate with an electrode layer therebetween and power generating regions of the multilayered body are sectioned by trenches and these are connected in series (e.g., Patent Document 3).

[Patent Document 1] Japanese Published Patent Application No. H10-335683

[Patent Document 2] Japanese Published Patent Application No. S59-124772

[Patent Document 3] Japanese Published Patent Application No. 2005-038907

SUMMARY OF THE INVENTION

Amorphous silicon thin films, micro crystal silicon thin films, or polycrystalline silicon thin films are formed with use of any of various deposition methods such as a chemical deposition method (e.g., plasma CVD) or a physical deposition method. Thus, in the case of forming a photoelectric conversion layer using an amorphous silicon thin film or the like, a silicon thin film is formed entirely over a substrate, and then laser processing or a photolithography process is conducted so that integration of photoelectric conversion cells are easy. However, because it is difficult to form a single-crystal silicon thin film by a method of the above-described deposition methods, integration of photoelectric conversion cells using a single-crystal silicon thin film on one substrate have not been studied. Moreover, a multilayer junction type photoelectric conversion device module in which a cell using a non-single-crystal silicon thin film is stacked on a cell using a single-crystal silicon thin film has not been studied either.

In view of the above-described problems, it is an object of one embodiment of the present invention to provide a novel manufacturing method of a photoelectric conversion device and a photoelectric conversion device module. Further, it is another object of one embodiment of the present invention to provide a photoelectric conversion device and a photoelectric conversion device module with improved photoelectric conversion efficiency. Moreover, another embodiment of the present invention is to provide a resource-saving photoelectric conversion device and a photoelectric conversion device module which efficiently utilize a semiconductor material.

One embodiment of the present invention is a photoelectric conversion device module in which a plurality of multiple junction-type photoelectric conversion cells are provided, and the multiple junction is formed by a stacked body of a cell including a single-crystal semiconductor layer sliced from a single-crystal semiconductor substrate and a cell including a non-single-crystal semiconductor layer formed by any of various kinds of deposition methods. In this specification, the term "slice" "sliced" or "slicing" means that a thin single-crystal semiconductor layer is obtained from a single-crystal semiconductor substrate by separation.

Each photoelectric conversion cell includes a single-crystal silicon layer which constitutes part of a bottom cell and which is formed by being sliced from a single-crystal semiconductor substrate such as a single-crystal silicon substrate. Specifically, a plurality of single-crystal silicon substrates are attached to one substrate (also referred to as the same substrate) with an insulating layer and a first electrode therebetween and arranged with a predetermined interval. The plurality of single-crystal silicon substrates are each sliced so that a single-crystal silicon layer on a superficial layer is separated. Then, a stacked body in which the first electrode and the single-crystal silicon layer are sequentially formed over the one substrate with the insulating layer therebetween is formed. The stacked bodies are arranged with the same arrangement as the plurality of single-crystal silicon substrates attached.

In the plurality of stacked bodies arranged with a predetermined interval therebetween, at least a semiconductor layer that is single-crystallized is formed to cover the plurality of stacked bodies arranged with a predetermined interval therebetween and spaces between the adjacent stacked bodies. An impurity semiconductor layer forming a semiconductor junction with the stacked bodies is formed over the semiconductor layer, so that a photoelectric conversion layer constituting a bottom cell is formed.

Further, a non-single-crystal semiconductor layer forming a semiconductor junction such as a pin junction is stacked to cover the photoelectric conversion layer constituting the bottom cell, and thus a photoelectric conversion layer constituting a top cell is formed. Then, a second electrode layer is formed over the top cell.

The photoelectric conversion layer of the bottom cell, the photoelectric conversion layer of the top cell and the second electrode which have been formed on the same substrate are selectively etched, so that a plurality of element-separated photoelectric conversion cells are formed. Specifically, photoelectric conversion layer of the bottom cell, the photoelectric conversion layer of the top cell and the second electrode are selectively etched in such a way that sectioning occurs at a space between stacked bodies, and the first electrode of each stacked body is partially exposed, thereby forming the plurality of photoelectric conversion cells arranged with a predetermined interval therebetween are formed.

Between adjacent photoelectric conversion cells, a connecting electrode extending from the second electrode of one photoelectric conversion cell to the first electrode of the other photoelectric conversion cell is formed so that a serially-connected photoelectric conversion device module is manufactured.

One embodiment of the present invention is a method for manufacturing a photoelectric conversion device module, comprising: preparing a plurality of single-crystal semiconductor substrates and a base substrate; wherein the plurality of single-crystal semiconductor substrates each have a first conductivity type, and a first electrode and an insulating layer are formed over one surface of each of the single-crystal semiconductor substrates and an embrittlement layer is formed inside each of the single-crystal semiconductor substrates; bonding the plurality of single-crystal semiconductor substrates to the base substrate by arranging, with the first electrode and the insulating layer therebetween, the plurality of single-crystal semiconductor substrates over the base substrate with an interval therebetween, and bonding the insulating layer and the base substrate; separating each of the plurality of single-crystal semiconductor substrates as the embrittlement layer as a boundary, whereby a plurality of stacked bodies in which the insulating layer, the first electrode and the first single-crystal semiconductor layer having the first conductivity type are stacked sequentially; forming at least a second single-crystal semiconductor layer that is single-crystallized over the stacked bodies so as to cover the plurality of stacked bodies and a space between the adjacent stacked bodies; forming a first photoelectric conversion layer in which the single-crystal semiconductor layer, the second single-crystal semiconductor layer and the second impurity semiconductor layer are stacked by forming a second impurity semiconductor layer having a second conductivity type over the second single-crystal semiconductor layer; forming a second photoelectric conversion layer by sequentially stacking a third impurity semiconductor layer having the first conductivity type, a non-single-crystal semiconductor layer and a fourth impurity semiconductor layer having the second conductivity type over the second impurity semiconductor layer; forming a second electrode over the fourth impurity semiconductor layer; selectively etching the second electrode, the second photoelectric conversion layer and the first photoelectric conversion layer so that the stacked bodies are sectioned at the space between the plurality of stacked bodies and the first electrode of each of the stacked bodies is partially exposed, whereby a plurality of photoelectric conversion cells arranged over the base substrate with an interval therebetween are formed; and forming, between the adjacent photoelectric conversion cells, a connecting electrode extending from the second electrode of one photoelectric conversion cell to the first electrode of the other photoelectric conversion cell.

One embodiment of the present invention is a method for manufacturing a photoelectric conversion device module, comprising: preparing a plurality of single-crystal semiconductor substrates and a base substrate; wherein the plurality of single-crystal semiconductor substrates each have a first conductivity type, and a first electrode are formed over one surface of each of the single-crystal semiconductor substrates and an embrittlement layer is formed inside each of the single-crystal semiconductor substrates, and the base substrate has one surface provided with an insulating layer; attaching the plurality of single-crystal semiconductor substrates to the base substrate provided with the insulating layer by arranging, with the first electrode therebetween, the plurality of single-crystal semiconductor substrates over the base substrate with an interval therebetween, and bonding the insulating layer and the first electrode by ultrasonic wave bonding; separating each of the plurality of single-crystal semiconductor substrates as the embrittlement layer as a boundary, whereby a plurality of stacked bodies in which the first electrode and the first single-crystal semiconductor layer having the first conductivity type are stacked sequentially are formed over the base substrate provided with the insulating layer; forming at least a second single-crystal semiconductor layer that is single-crystallized over the stacked bodies so as to cover the plurality of stacked bodies and a space between the adjacent stacked bodies; forming a first photoelectric conversion layer in which the single-crystal semiconductor layer, the second single-crystal semiconductor layer and the second impurity semiconductor layer are stacked by forming a second impurity semiconductor layer having a second conductivity type opposite to the first conductivity type over the second single-crystal semiconductor layer; forming a second photoelectric conversion layer by sequentially stacking a third impurity semiconductor layer having the first conductivity type, the non-single-crystal semiconductor layer and a fourth impurity semiconductor layer having the second conductivity type over the second impurity semiconductor layer; forming a second electrode over the fourth impurity semiconductor layer; selectively etching the second electrode, the second photoelectric conversion layer and the first photoelectric conversion layer so that the stacked bodies are sectioned at the space between the plurality of stacked bodies and the first electrode of each of the stacked bodies is partially exposed, whereby a plurality of photoelectric conversion cells arranged over the base substrate with an interval therebetween are formed; and forming, between the adjacent photoelectric conversion cells, a connecting electrode extending from the second electrode of one photoelectric conversion cell to the first electrode of the other photoelectric conversion cell.

In the structure in which the first electrode and the insulating layer are bonded by ultrasonic wave bonding, preferably, the first electrode is formed using aluminum, and the insulating layer is formed with a silicon nitride layer, a silicon nitride oxide layer, or a silicon oxynitride layer.

In any of the above structures, the second single-crystal semiconductor layer can be formed to have improved crystallinity by solid growth by heat treatment after the non-single-crystal semiconductor layer is formed to cover the plurality of stacked bodies and the space between the adjacent stacked bodies. Alternatively, the second single-crystal semiconductor layer can be formed by vapor-phase growth of a semiconductor film formed by a plasma CVD method so as to cover the plurality of stacked bodies and the space between the adjacent stacked bodies.

In any of the above structures, the embrittlement layer can be formed by introducing hydrogen, helium or halogen into the inside of the single-crystal semiconductor substrate. Alternatively, the embrittlement layer can be formed by scanning with a laser beam that allows multiphoton absorption, while a focal point of the laser beam is focused inside the single-crystal semiconductor substrate.

In any of the above structures, the base substrate is preferably a glass substrate.

In any of the above structures, preferably, the first conductivity type is an n-type, and the second conductivity type is a p-type.

One embodiment of the present invention is a photoelectric conversion device module comprising: a plurality of photoelectric conversion cells which are arranged over one substrate having an insulating surface with an interval therebetween; each of the plurality of the photoelectric conversion cells including: a first electrode over the substrate with an insulating layer therebetween; a first unit cell in which a first single-crystal semiconductor layer having a first conductivity type, a second single-crystal semiconductor layer and a second impurity semiconductor layer having a second conductivity type are sequentially stacked over the first electrode; a second unit cell in which a third impurity semiconductor layer having the first conductivity type, a non-single-crystal semiconductor layer and a fourth impurity semiconductor layer having the second conductivity type are sequentially stacked over the first unit cell; a second electrode provided over the second unit cell; an auxiliary electrode selectively provided over the second electrode; and a connecting electrode, between adjacent photoelectric conversion cells, extending from the second electrode of one photoelectric conversion cell to the first electrode of the other photoelectric conversion cell.

In the above structure, the connecting electrode is preferably formed from the same layer as the auxiliary electrode. Further, the one substrate having the insulating surface is preferably a glass substrate.

In the above structure, preferably, the first conductivity type is an n-type and the second conductivity type is a p-type.

Note that in this specification, the term "multiple junction type" means that a plurality of unit cells are stacked. Alternatively, the term is also referred to a multilayer type (tandem type or stack type), a multi-junction type.

Note that the term "single crystal" or "single-crystal" in this specification refers to a crystal in which crystal faces and crystal axes are aligned and atoms or molecules which are included in the single crystal are aligned in a spatially ordered manner. Although single crystals are structured by orderly aligned atoms, single crystals may include a lattice defect in which the alignment is disordered as part or single crystals may include intended or unintended lattice strain.

Note that the term "embrittlement layer" in this specification refers to a region at which a single-crystal semiconductor substrate is separated into a single-crystal semiconductor layer and a separation substrate (a single-crystal semiconductor substrate) in a separation step, and its vicinity. The states of the "embrittlement layer" vary according to a method for forming the "embrittlement layer". For example, the "embrittlement layer" indicates a region which is weakened by locally distorting its crystal structure. Note that a region from the surface side of the single-crystal semiconductor substrate to the "embrittlement layer" is somewhat weakened depending on a case. However, the "embrittlement layer" in this specification refers to a region in which separation is performed later and its vicinity.

A photoelectric conversion layer in this specification includes in its category a semiconductor layer by which a photoelectric (internal photoelectric) effect is achieved and moreover an impurity semiconductor layer bonded for forming an internal electric field or a semiconductor junction. That is to say, the photoelectric conversion layer refers to a semiconductor layer having junction typified by a pn junction, a pin junction, or the like.

Note that in this specification, a numeral such as "first", "second", "third", or "fourth" which are included in a term is given for convenience in order to distinguish elements, does not limit the number and does not limit the arrangement and the order of the steps.

According to one embodiment of the present invention, a manufacturing method of a novel photoelectric conversion device and a novel photoelectric conversion device module in which multi junction type photoelectric conversion devices are integrated is provided. In each of the multi junction type photoelectric conversion devices, a cell including a single-crystal semiconductor layer and a cell including a non-single-crystal semiconductor layer are stacked. Alternatively, a resource-saving photoelectric conversion device having improved photoelectric conversion efficiency can be provided since it can be formed using a cell including a single-crystal semiconductor layer sliced from a single-crystal semiconductor substrate. Alternatively, since a photoelectric conversion device module in which resource-saving photoelectric conversion devices having higher efficiency are integrated can be provided, excellent photoelectric conversion characteristics are achieved and thus desired power can be obtained.

DETAILED DESCRIPTION OF THE INVENTION

Figure 1:
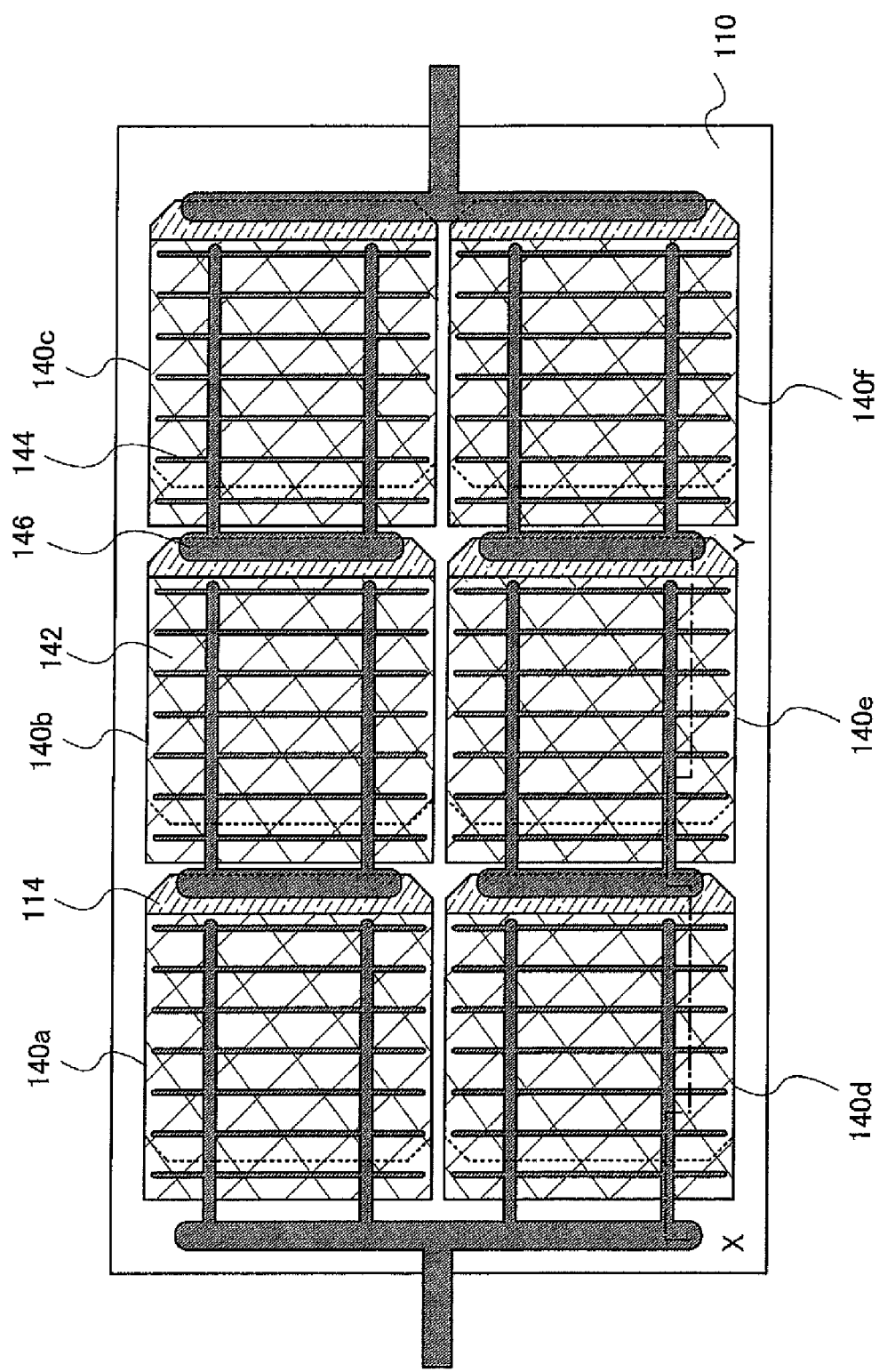
FIG. 1 is a schematic view illustrating a photoelectric conversion device module according to one embodiment of the present invention.

Embodiments of the present invention will be explained with reference to the drawings. However, the present invention is not limited to the description below, and it is to be easily understood by those skilled in the art that various changes in modes and details thereof will be apparent without departing from the purpose and spirit of the present invention. Therefore, the present invention is not interpreted as being limited to the following description of the embodiments. In the structures of the present invention described below, the same reference numerals indicating the same things are used in common through the drawings.

Embodiment 1

One mode of the present invention is a photoelectric conversion device module including, over one substrate, a plurality of photoelectric conversion cells (photoelectric conversion devices) in which a cell including a single-crystal semiconductor layer and a cell including a non-single-crystal semiconductor layer are stacked. The stack of the cell including a single-crystal semiconductor layer and the cell including a non-single-crystal semiconductor layer forms a multiple junction.

Figure 2:
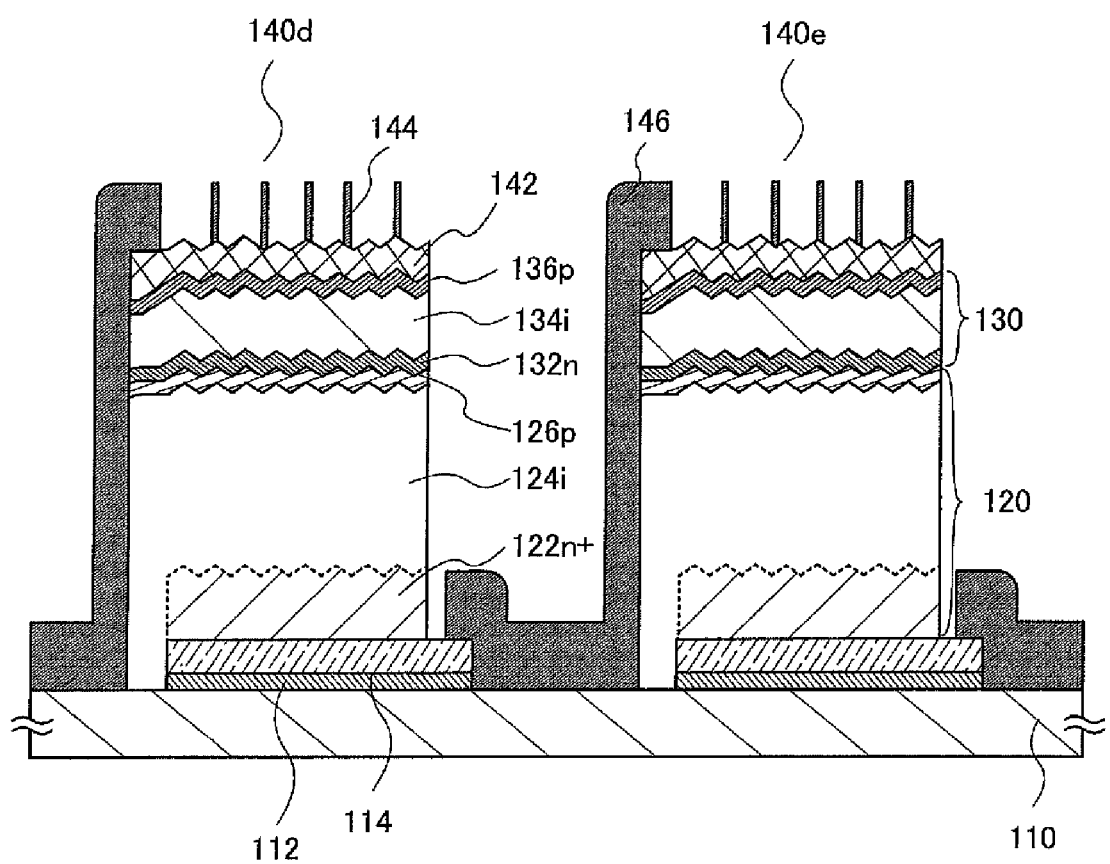
FIG. 2 is a cross-sectional schematic view illustrating a photoelectric conversion device module according to one embodiment of the present invention.

FIG. 1 is a schematic planar view of a photoelectric conversion device module in which a plurality of photoelectric conversion cells are provided over one substrate and are connected in series and/or in parallel. In addition, FIG. 2 illustrates a cross-sectional schematic view taken along the section line X-Y in FIG. 1. In this case is illustrated an example in which a plurality of planar photoelectric conversion devices are arranged over the one substrate having an insulating surface with a predetermined interval therebetween. Further, a module in which some photoelectric conversion cells are connected in series as a group and such groups including serially-connected photoelectric conversion cells are connected in parallel is illustrated as an example. Moreover, an example of provision of a positive terminal and a negative terminal that extract power generated by the serially- and/or parallel connected photoelectric cells is illustrated. Note that the number of photoelectric conversion cells provided over the substrate, the area of the photoelectric conversion cells, the method of connecting the photoelectric conversion cells in series or in parallel, the number of the serially-connected photoelectric conversion cells or the parallel-connected photoelectric conversion cells, the method for extracting power from the photoelectric conversion device module, and the like are optional, and can be determined depending on desired power (and current, voltage) or an installation location by a person who carries out this invention.

In this embodiment, as the one substrate having an insulating surface, an example in which six planar photoelectric conversion cells 140a, 140b, 140c, 140d, 140e and 140f are arranged over a base substrate 110 with a predetermined interval is illustrated. An example is illustrated, adjacent photoelectric conversion cells among the photoelectric conversion cells 140a to 140f are connected to each other, and two groups each including three photoelectric conversion cells that are connected in series are arranged and the two groups including the photoelectric conversion cells are connected in parallel.

There are no particular limitations on planar shapes of the photoelectric conversion cells 140a to 140f, and a rectangular shape including a square, a polygonal shape or a circular shape can be employed. For example, the photoelectric conversion cells 140a to 140f have a planar shape of about 10 cm×10 cm. In addition, the interval between the adjacent photoelectric conversion cells is about 1 mm.

There are no particular limitations over the base substrate 110, and any substrate that can withstand in a manufacturing process of a photoelectric conversion device according to one embodiment of the present invention, for example, a substrate having an insulating surface or an insulating substrate can be used. In addition, when light enters from the base substrate 110 side, a substrate having a light-transmitting property is used. Concretely, a variety of glass substrates used for electronic industries (e.g. aluminosilicate glass, aluminoborosilicate glass, or barium borosilicate glass), a quartz substrate, a ceramic substrate, or a sapphire substrate can be given as an example. It is preferable to use an inexpensive glass substrate that can be made larger in terms of low cost and improvement in productivity. Substrates having a large area can be used for the base substrate 110, which are typified by glass substrates used for liquid crystal displays having a size of 300 mm×400 mm (the first generation), 550 mm×650 mm (the third generation), 730 mm×920 mm (the fourth generation), 1000 mm×1200 mm (the fifth generation), 2450 mm×1850 mm (the sixth generation), 1870 mm×2200 mm (the seventh generation), and 2000 mm×2400 mm (the eighth generation), or the like.

In each of the photoelectric conversion cells 140a to 140f, a first electrode 114 is provided over the base substrate 110 with an insulating layer 112 therebetween, a first unit cell 120 including a single-crystal semiconductor layer is provided over the first electrode 114, and a second unit cell 130 including a non-single-crystal semiconductor layer is provided over the first unit cell 120. A second electrode 142 is provided over the second unit cell 130, and an auxiliary electrode 144 is provided over the second electrode 142. The first unit cell 120 and the second unit cell 130 are sandwiched between the first electrode 114 and the second electrode 142 that are a pair of electrodes. In this case, the second electrode 142 is an incident face of light (light enters from the second electrode 142 side). Thus, preferably, the auxiliary electrode 144 is selectively provided over the second electrode 142, and for example, the auxiliary electrode 144 is provided to have a top surface of a shape such as a comb-like shape, a pectinated shape or a grid shape.

The first unit cell 120 has a structure in which a first impurity semiconductor layer 122n+ of a first conductivity type, a single-crystal semiconductor layer 124i, and a second impurity semiconductor layer 126p of a second conductivity type are stacked in this order. The thickness of the single-crystal semiconductor layer including the first impurity semiconductor layer 122n+ constituting a part of the first unit cell 120 is from 1 µm to 10 µm, preferably from 2 µm to 8 µm.

The first impurity semiconductor layer 122n+ is formed from a single-crystal semiconductor layer which is sliced off from a single-crystal semiconductor substrate. Typically, a single-crystal silicon layer which is sliced off from a single-crystal silicon substrate is used to form the first impurity semiconductor layer 122n+. In this embodiment, the single-crystal semiconductor layer which is sliced off from the single-crystal semiconductor substrate of the first conductivity type serves as the first impurity semiconductor layer 122n+ for formation of an internal electric field or a semiconductor junction. Alternatively, a polycrystalline semiconductor substrate (typically a polycrystalline silicon substrate) can be used instead of the single-crystal semiconductor substrate. In this case, the first impurity semiconductor layer 122n+ is formed from a polycrystalline semiconductor (typically polycrystalline silicon).

The single-crystal semiconductor layer 124i is formed as follows: a single-crystal semiconductor layer sliced off from a single-crystal semiconductor substrate is subjected to crystal growth by an epitaxial growth method such as solid phase epitaxy or vapor phase epitaxy.

The first impurity semiconductor layer 122n+ is a single-crystal semiconductor layer of the first conductivity type, and thus a stack layer of the first single-crystal semiconductor layer of the first conductivity type (the first impurity semiconductor layer 122n+) and the second single-crystal semiconductor layer (single-crystal semiconductor layer 124i) is formed.

The second unit cell 130 has a structure in which a third impurity semiconductor layer 132n of the first conductivity type, an non-single-crystal semiconductor layer 134i, and a fourth impurity semiconductor layer 136p of the second conductivity type are stacked in this order. The thickness of the non-single-crystal semiconductor layer 134i constituting a part of the second unit cell 130 is from 0.1 µm to 0.5 µm, preferably from 0.2 µm to 0.3 µm.

The non-single-crystal semiconductor layer 134i is formed from an amorphous semiconductor (typically amorphous silicon) or a micro crystal semiconductor (typically micro crystal silicon) by a chemical vapor deposition (CVD) method typified by a plasma CVD method. Typically, a semiconductor source gas can be used as a reaction gas, and a plasma CVD apparatus can be used to form the non-single-crystal semiconductor layer. As the semiconductor source gas, a silicon hydride typified by silane or disilane, a silicon chloride typified by $SiH_2Cl_2$, $SiHCl_3$, $SiCl_4$ or the like, or a silicon fluoride typified by $SiF_4$ or the like can be used. In addition, the non-single-crystal semiconductor layer can be formed using a reaction gas in which a semiconductor source gas is diluted with a dilution gas. Hydrogen is a typical example of the dilution gas. One or more kinds of rare gases selected from helium, argon, krypton, and neon can be used as the dilution gas. Further, as the dilution gas, plural kinds of gases (e.g., hydrogen and argon) can be used in combination. The non-single-crystal semiconductor layer can be formed using the reaction gas with a plasma CVD apparatus by applying a high-frequency electric power with a frequency of from 1 MHz to 200 MHz. Instead of applying the high-frequency electric power, a microwave electric power with a frequency of from 1 GHz to 5 GHz, typically 2.45 GHz may be applied. The non-single-crystal semiconductor layer can be formed using glow discharge plasma in a reaction chamber of a plasma CVD apparatus with use of a mixture of silicon hydride (typically silane) and hydrogen. The glow discharge plasma is produced by applying high-frequency power with a frequency of from 1 MHz to 20 MHz, typically 13.56 MHz, or high-frequency power with a frequency of 20 MHz to about 120 MHz, typically 27.12 MHz or 60 MHz. The substrate is heated at from 100° C. to 300° C., preferably at from 120° C. to 220° C. A micro crystal semiconductor or an amorphous semiconductor can be formed by changing deposition conditions such as the flow rate of the gases and applied power.

It is to be noted that "non-single-crystal semiconductor layer 134i" in this specification is an intrinsic or substantially intrinsic semiconductor layer other than a single-crystal semiconductor, and refers to a semiconductor which has an impurity imparting p-type conductivity or n-type conductivity included in the non-single-crystal semiconductor layer 134i at a concentration of $1\times10^{20}/cm^3$ or less and oxygen and nitrogen each at a concentration of $9\times10^{19}/cm^3$ or less and which has photoconductivity of 100 times or more the dark conductivity. Boron may be added to the non-single-crystal semiconductor layer 134i at 1 ppm to 1000 ppm. That is, there is a case where the non-single-crystal semiconductor layer 134i has weak n-type conductivity when an impurity element for controlling valence electrons is not added intentionally; in that case, an impurity element imparting p-type conductivity may be added at the same time as film formation or after film formation. An impurity element imparting p-type conductivity is typically boron, and the concentration of a p-type impurity included in the non-single-crystal semiconductor is approximately $1\times10^{14}/cm^3$ to $6\times10^{16}/cm^3$.

The second impurity semiconductor layer 126p, the third impurity semiconductor layer 132n, and the fourth impurity semiconductor layer 136p can be formed in a similar manner to the non-single-crystal semiconductor layer 134i, and an n-type or p-type impurity semiconductor layer can be formed by mixing a doping gas including an impurity element imparting an n-type or p-type conductivity into a mixture gas. For example, a doping gas imparting a p-type conductivity (e.g., diborane) is mixed so that a p-type impurity semiconductor layer can be formed. In addition, a doping gas imparting an n-type conductivity (e.g., phosphine) is mixed so that an n-type impurity semiconductor layer can be formed.

One of the first impurity semiconductor layer 122n+ of the first conductivity type and the second impurity semiconductor layer 126p of the second conductivity type included in the first unit cell 120 is an n-type semiconductor and the other is a p-type semiconductor. The first conductivity type is opposite to the second conductivity type. The n-type semiconductor is a semiconductor layer including an impurity element imparting an n-type conductivity. As the impurity element imparting R-type conductivity, phosphorus, arsenic, antimony, and the like, which are Group 15 elements in the periodic table, are typically given. The p-type semiconductor is a semiconductor layer including an impurity element imparting a p-type conductivity. As the impurity element imparting a p-type conductivity, boron, aluminum, and the like, which are Group 13 elements in the periodic table, are typically given. Similarly, one of the third impurity semiconductor layer 132n of the first conductivity type and the fourth impurity semiconductor layer 136p of the second conductivity type is an n-type semiconductor and the other is a p-type semiconductor. In this embodiment, an n-type single-crystal semiconductor substrate is sliced to form the first impurity semiconductor layer 122n+ that is an n-type single-crystal semiconductor layer. In addition, the n-type third impurity semiconductor layer 132n including an impurity element imparting an n-type conductivity is formed. In addition, the p-type second impurity semiconductor layer 126p and the p-type fourth impurity semiconductor layer 136p each including an impurity element imparting a p-type conductivity are formed. The first unit cell 120 of this embodiment forms an nip junction (or a pin junction) by the first impurity semiconductor layer 122n+ of the first conductivity type, the single-crystal semiconductor layer 124i and the second impurity semiconductor layer 126p of the second conductivity type. In addition, the second unit cell 130 forms an nip junction (or a pin junction) by the third impurity semiconductor layer 132n of the first conductivity type, the non-single-crystal semiconductor layer 134i and the fourth impurity semiconductor layer 136p of the second conductivity type. A pn junction is formed at a junction portion of the first unit cell 120 and the second unit cell 130. By the pn junction at the junction portion of the first unit cell 120 and the second unit cell 130, a recombination center is formed at the junction interface and a recombination current flows.

Typically, single-crystal silicon is used as the single-crystal semiconductor layer 124i constituting a part of the first unit cell 120, and the band gap thereof is 1.1 eV. In addition, typically, amorphous silicon is used as the non-single-crystal semiconductor layer 194i constituting a part of the second unit cell 130, and the band gap thereof is in the range from 1.6 eV to 1.8 eV. The second unit cell 130 has a photoelectric conversion layer having a band gap wider than the single-crystal semiconductor layer 124i. Thus, power generation can be conducted with use of light in the long wavelength region owing to the first unit cell 120, and with use of light in the short wavelength region owing to the second unit cell 130. Because solar light has a wide wavelength band, power generation can be conducted efficiently by employing the structure of this embodiment. In addition, by stacking unit cells having sensitivities to light with different wavelength regions, and arranging the unit cell having a sensitivity to light in the short wavelength region on the light incident side, power generation efficiency can be improved.

FIG. 2 illustrates arrangement of a photoelectric conversion cell 140d and a photoelectric conversion cell 140e that are adjacent to each other as an example. The adjacent photoelectric conversion cells 140d and 140e are electrically connected in series via a connecting electrode 146 that exists between a first electrode 114 of one photoelectric conversion cell (the photoelectric conversion cell 140d here) and a second electrode 142 of the other photoelectric conversion cell (the photoelectric conversion cell 140e). In addition, in the photoelectric conversion cell 140e, short-circuiting is prevented by the single-crystal semiconductor layer 124i formed between a connecting electrode 146 in contact with the second electrode 142 of the photoelectric conversion cell 140e and the first electrode 114 of the photoelectric conversion cell 140e. The connection electrode 146 is formed with the same layer of the auxiliary electrode 144.

As described above, because the photoelectric conversion cell according to this embodiment has a stack structure in which unit cells having sensitivities to different wavelengths are stacked, power generation efficiencies are improved, and further desired electric power can be efficiently generated by connecting the photoelectric conversion cells in series.

Next, a manufacturing method of a photoelectric conversion device module according to one embodiment of the present invention is described with reference to drawings.

Figure 3A:
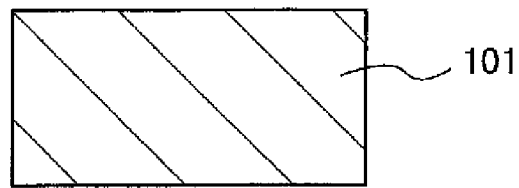
FIGS. 3A to 3D are cross-sectional views illustrating a manufacturing method of a photoelectric conversion device module according to one embodiment of the present invention.

A single-crystal semiconductor substrate 101 is prepared (see FIG. 3A).

As the single-crystal semiconductor substrate 101, a single-crystal silicon substrate is typically employed. Alternatively, a known single-crystal semiconductor substrate can be used; for example, a single crystal germanium substrate, a single-crystal silicon-germanium substrate, or the like can be used. As an alternative to the single-crystal semiconductor substrate 101, a polycrystalline semiconductor substrate can be used; typically, a polycrystalline silicon substrate can be used. Therefore, in the case of using a polycrystalline semiconductor substrate instead of the single-crystal semiconductor substrate, the "single-crystal semiconductor" in the description below can be replaced by a "polycrystalline semiconductor".

The single-crystal semiconductor substrate 101 can be an n-type single-crystal semiconductor substrate or a p-type single-crystal semiconductor substrate. Further, a high-concentration n-type single-crystal semiconductor substrate or a high-concentration p-type single-crystal semiconductor substrate can be used. For example, the concentration of an n-type impurity element in the n-type single-crystal semiconductor substrate is about $1 \times 10^{14}$ atoms/cm$^3$ to about $1 \times 10^{17}$ atoms/cm$^3$, and the specific resistance thereof is about $1 \times 10^{-1}$ Ω·cm to about 10 Ω·cm, whereas the concentration of an n-type impurity element in the high impurity n-type single-crystal semiconductor substrate is about $1 \times 10^{18}$ atoms/cm$^3$ to about $1 \times 10^{20}$ atoms/cm$^3$, and the specific resistance thereof is about $1 \times 10^{-3}$ Ω·cm to about $1 \times 10^{-1}$ Ω·cm. In an example of this embodiment, a high-concentration n-type single crystal semiconductor substrate is used as the single-crystal semiconductor substrate 101. Hereinafter in this specification, a high-concentration n-type and a high-concentration n-type region are also referred to an n+ type and an n+ region respectively, and a high-concentration p-type and a high-concentration p-type region are also referred to a p+ type and a p+ region respectively.

In addition, the high-concentration n-type single-crystal semiconductor substrate or the high-impurity p-type single-crystal semiconductor substrate may be a substrate whose concentration is adjusted at the phase of a single crystal ingot. Alternatively, an impurity element imparting an n-type or p-type conductivity may be introduced to a single-crystal semiconductor substrate cut out of a single crystal ingot so that the concentration may be adjusted. Introduction of the impurity element imparting an n-type or p-type conductivity may be conducted by an ion doping method, a vapor phase thermal diffusion method, or a liquid phase application method so that the impurity element is uniformly diffused into the single-crystal semiconductor substrate.

The single-crystal semiconductor substrate 101 may have a size (an area, a planar shape, thickness, and the like) corresponding to the specifics of an apparatus and the like used in a manufacturing process of the photoelectric conversion device. For example, as for the shape of the single-crystal semiconductor substrate 101, a widely distributed circular substrate or a substrate processed into a desired shape can be used.

An example of processing the single-crystal semiconductor substrate 101 will now be described. For example, the single-crystal semiconductor substrate 101 illustrated in FIGS. 11A to 11D can be applied.

Figure 11A:
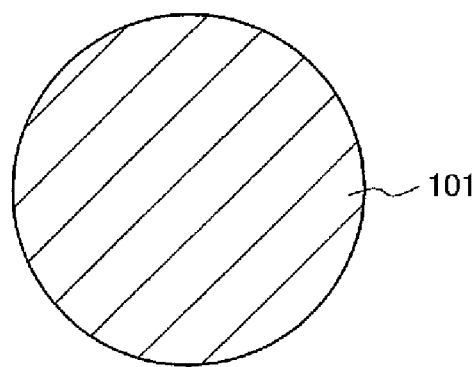
FIGS. 11A to 11D illustrate examples in which a single-crystal semiconductor substrate having a desired shape is cut out of a circular single-crystal semiconductor substrate.
Figure 11B:
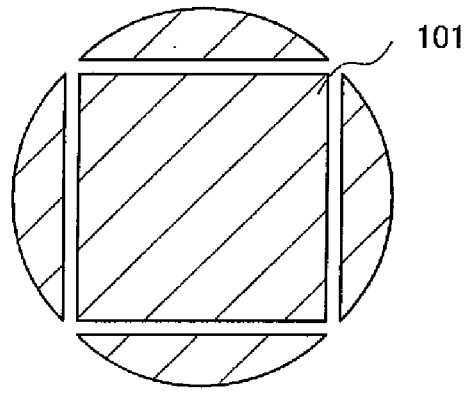
Figure 11C:
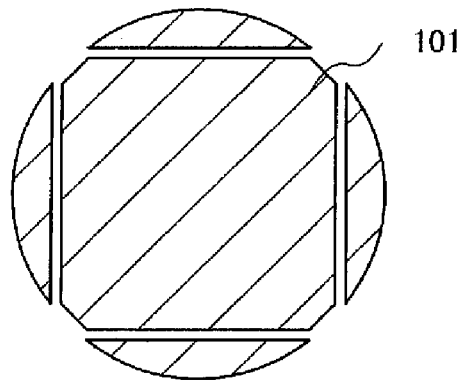

A circular single-crystal semiconductor substrate 101 may be used as illustrated in FIG. 11A, and alternatively, a substantially rectangular single-crystal semiconductor substrate 101 may be cut out from a circular substrate, as illustrated in each of FIGS. 11B and 11C.

FIG. 11B illustrates an example in which the rectangular single-crystal semiconductor substrate 101 is cut out to have a rectangular shape of maximum size with its corners being in contact with the periphery of the circular single-crystal semiconductor substrate 101. The angle at each corner of the single-crystal semiconductor substrate 1001 is about 90 degrees.

FIG. 11C illustrates an example in which the single-crystal semiconductor substrate 101 is cut out so that the distance between opposing lines is longer than that of the rectangular region with the maximum size whose corners are in contact with the periphery of the circular single-crystal semiconductor substrate 101. The angle at each corner of the single-crystal semiconductor substrate 101 is not 90 degrees, and the single-crystal semiconductor substrate 101 has a polygonal shape, not a rectangular shape.

Figure 11D:
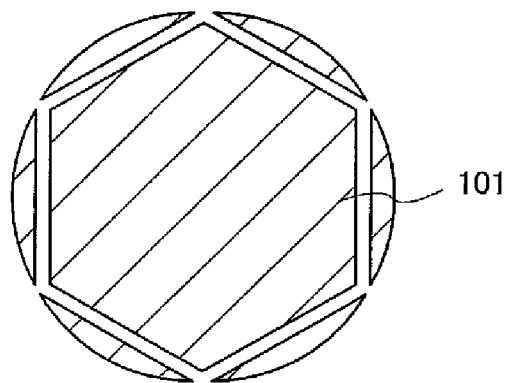

Further alternatively, as shown in FIG. 11D, a hexagonal single-crystal semiconductor substrate 101 may be cut out. FIG. 11D illustrates an example in which the hexagonal single-crystal semiconductor substrate 101 is cut out to have a hexagonal shape of maximum size with its corners being in contact with the periphery of the circular single-crystal semiconductor substrate 101. A hexagonal single-crystal semiconductor substrate is cut out, whereby the waste corresponding to a cutting margin can be reduced more than the case of cutting out a rectangular single-crystal semiconductor substrate.

Here is described the example in which a substrate with a desired shape is cut out from a circular single-crystal semiconductor substrate. However, one embodiment of the present invention is not limited thereto, and a substrate with a desired shape may be cut out from a substrate with a shape other than a circular shape. By utilizing a single-crystal semiconductor substrate processed into a desired shape, a photoelectric conversion device module can have a shape appropriate for a purpose, such as a shape which is easily adapted to a manufacturing apparatus for manufacturing a photoelectric conversion device module or a shape with which the photoelectric conversion device is easily connected to another photoelectric conversion device module.

The thickness of the single-crystal semiconductor substrate 101 may be based on the SEMI specification which is generally known or may be adjusted as appropriate when being cut out from an ingot. When the single-crystal semiconductor substrate is cut out from an ingot so as to have a large thickness, a cutting margin, that is, a waste of a raw material can be reduced.

The single-crystal semiconductor substrate 101 may have a large area. As for single-crystal silicon substrates, large substrates with a diameter of 100 mm (4 inches), a diameter of 150 mm (6 inches), a diameter of 200 mm (8 inches), a diameter of 300 mm (12 inches), and the like are widely distributed. In recent years, a large substrate with a diameter of 400 mm (16 inches) has appeared in the market. For the future, substrates of 16 inches or more are expected and a substrate with a diameter of 450 mm (18 inches) is anticipated as a next-generation substrate. By employing a large-area single semiconductor substrate as the single-crystal semiconductor substrate 101, a plurality of photoelectric conversion cells can be formed from one substrate, and the area (non-power-generating region) of a space produced due to arrangement of the plural photoelectric conversion cells can be reduced, which leads to improvement of productivity.

Figure 3B:
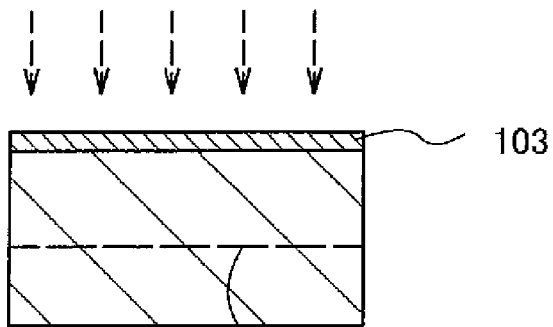

An embrittlement layer 105 is formed in a region at a predetermined depth from one surface of the single-crystal semiconductor substrate 101 (FIG. 3B).

The embrittlement layer 105 refers to a region at which the single-crystal semiconductor substrate 101 is separated into a single-crystal semiconductor layer and a separation substrate (a single-crystal semiconductor substrate) in a separation step which is described later, and its vicinity. The depth at which the embrittlement layer 105 is to be formed is determined based on the thickness of the thin single-crystal semiconductor layer which is formed later by the separation.

As a method for forming the embrittlement layer 105, that is, a method in which irradiation with ions accelerated by voltage is performed, a method utilizing multiphoton absorption, or the like can be used.

For example, hydrogen, helium, or halogen is introduced into the single-crystal semiconductor substrate 101 to form the embrittlement layer 105. In one example shown in FIG. 3B, one surface of the single-crystal semiconductor substrate 101 is irradiated with ions accelerated by voltage to form the embrittlement layer 105 in a region at a predetermined depth of the single-crystal semiconductor substrate 101. The embrittlement layer 105 is formed in such a manner that the crystalline structure of a local region in the single-crystal semiconductor substrate 101 is distorted to weaken the region by irradiating the single-crystal semiconductor substrate 101 with ions (typically hydrogen ions) accelerated by voltage so that the ions or an element of the ions (hydrogen in the case of using hydrogen ions) is introduced into the single-crystal semiconductor substrate 101.

In this specification, the term "ion implantation" refers to a method in which ions produced from a source gas are mass-separated and delivered to an object, so that an element of the ion is added to the object. Further, the term "ion doping" refers to a method in which ions produced from a source gas are delivered to an object without mass separation, so that an element of the ion is added to the object. The embrittlement layer 105 can be formed using an ion implantation apparatus with mass separation or an ion doping apparatus without mass separation.

The depth at which the embrittlement layer 105 is formed in the single-crystal semiconductor substrate 101 (here, the depth from the irradiated surface of the single-crystal semiconductor substrate 101 to the embrittlement layer 105 in the film thickness direction) is determined by the control of the voltage for accelerating irradiation ions and/or the tilt angle (the tilt angle of the substrate). Therefore, in consideration of the desired thickness of the single-crystal semiconductor layer after the slice, the voltage for accelerating the irradiation ions and/or the tilt angle is determined.

As the irradiation ions, the use of hydrogen ions generated from a source gas including hydrogen is preferable. When the single-crystal semiconductor substrate 101 is irradiated with hydrogen ions, hydrogen is introduced thereto, so that the embrittlement layer 105 is formed in a region at a predetermined depth of the single-crystal semiconductor substrate 101. For example, hydrogen plasma is generated from a source gas including hydrogen and the ions generated in the hydrogen plasma are accelerated and delivered; thus, the embrittlement layer 105 can be formed. Instead of hydrogen or in addition to hydrogen, ions generated from a source gas including a rare gas typified by helium or halogen may be used to form the embrittlement layer 105. Note that the irradiation with particular ions is preferable because the region at the same depth in the single-crystal semiconductor substrate 101 is weakened in a concentrated manner.

For example, the single-crystal semiconductor substrate 101 is irradiated with ions generated from hydrogen, so that the embrittlement layer 105 is formed. By adjusting the acceleration voltage, the tilt angle, and the dosage of the irradiation ions, the embrittlement layer 105, which is the region doped with hydrogen at high concentration, can be formed at a predetermined depth of the single-crystal semiconductor substrate 101. The hydrogen doping concentration of the embrittlement layer 105 is controlled by the voltage for accelerating the ions, the tilt angle, the dosage, or the like. In the case of using the ions generated from hydrogen, the embrittlement layer 105 preferably includes hydrogen so that the peak value is greater than or equal to $1 \times 10^{19}$ atoms/cm$^3$ in terms of a hydrogen atom. The embrittlement layer 105, which is the region locally doped with hydrogen at high concentration, no longer has a crystalline structure but has a porous structure including microvoids. When heat treatment is performed at relatively low temperatures (about 700° C. or less), there is a change in the volume of the microvoids in the embrittlement layer 105, so that the single-crystal semiconductor substrate 101 can be separated at or near the embrittlement layer 105.

Note that a protective layer is preferably formed on the surface of the single-crystal semiconductor substrate 101 which is irradiated with the ions, in order to prevent damage to the single-crystal semiconductor substrate 101. In the example illustrated in FIG. 3B, an insulating layer 103 which can function as a protective layer is formed on at least one surface of the single-crystal semiconductor substrate 101 and the surface of the substrate where the insulating layer 103 is formed is irradiated with the ions accelerated by voltage. The insulating layer 103 is irradiated with the ions and the ions or an element of the ions that transmits through the insulating layer 103 is introduced to the single-crystal semiconductor substrate 101. Thus, the embrittlement layer 105 is formed in a region at a predetermined depth of the single-crystal semiconductor substrate 101. After the formation of the embrittlement layer 105, the insulating layer 103 that become unnecessary is removed.

As the insulating layer 103, an insulating layer such as a silicon oxide layer, a silicon nitride layer, a silicon nitride oxide layer, or a silicon oxynitride layer may be formed. For example, the insulating layer 103 can be formed in such a manner that the substrate is oxidized by being exposed to ozone water, hydrogen peroxide water, or an ozone atmosphere so that a chemical oxide is formed to a thickness of about from 2 nm to 5 nm on the surface of the single-crystal semiconductor substrate 101. Alternatively, the insulating layer 103 may be formed to a thickness of about from 2 nm to 10 mm on the surface of the single-crystal semiconductor substrate 101 by oxygen radical treatment or nitrogen radical treatment. Further alternatively, the insulating layer 103 may be formed to a thickness of about from 2 nm to 50 nm by a plasma CVD method.

Note that a silicon oxynitride layer means a layer that includes more oxygen than nitrogen and specifically includes oxygen, nitrogen, silicon, and hydrogen at concentrations ranging from 50 at. % to 70 at. %, 0.5 at. % to 15 at. %, 25 at. % to 35 at. %, and 0.1 at. % to 10 at. %, respectively in the case where measurements are performed using Rutherford backscattering spectrometry (RBS) and hydrogen forward scattering (HFS). Further, a silicon nitride oxide layer means a layer that includes more nitrogen than oxygen and specifically includes oxygen, nitrogen, silicon, and hydrogen at concentrations ranging from 5 at. % to 30 at. %, 20 at. % to 55 at. %, 25 at. % to 35 at. %, and 10 at. % to 30 at. %, respectively in the case where measurements are performed using RBS and HFS. Note that percentages of nitrogen, oxygen, silicon, and hydrogen fall within the ranges given above, where the total number of atoms contained in the silicon oxynitride film or the silicon nitride oxide film is defined as 100 at. %.

Figure 3C:
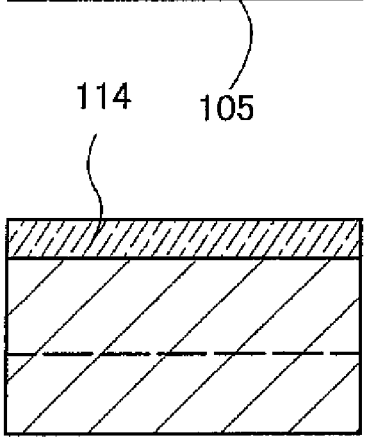

The first electrode 114 is formed on a surface of the single-crystal semiconductor substrate 101 (see FIG. 3C). The first electrode 114 is formed on a surface from which the insulating layer 103 is removed.

The first electrode 114 is formed from, for example, a metal material such as aluminum, nickel, copper, titanium, molybdenum, tungsten, tantalum, or chromium. With use of such a metal material, the first electrode 114 is formed to a thickness of 100 nm or more by an evaporation method or a sputtering method. The first electrode 114 can have a stacked structure of a metal material layer and a barrier layer, or a structure in which a metal material layer is sandwiched between barrier layers. As the barrier layer, a nitride layer of a metal material layer is preferable. For example, the first electrode 114 can have a stacked structure of a titanium nitride layer, an aluminum layer and a titanium nitride layer. Alternatively, a tantalum nitride layer may be used instead of the titanium nitride layer and a nickel layer may be used instead of the aluminum layer. Aluminum has low resistance and is inexpensive, and thus is preferable for the first electrode 114 in view of low cost. In addition, by providing a barrier layer in contact with the aluminum layer, generation of hillocks can be prevented. In addition, provision of a nitride layer of a metal material (e.g., a titanium nitride layer) between the metal material layer (e.g., an aluminum layer) and the single-crystal semiconductor substrate can improve adhesion between the single-crystal semiconductor substrate and the first electrode 114.

Note that, in a case where a native oxide layer or the like is formed on the surface of the single-crystal semiconductor substrate 101, the native oxide layer or the like is removed and then the first electrode 114 is formed. As described later in this embodiment, in the case of slicing the single-crystal semiconductor substrate 101 through heat treatment, the first electrode 114 is formed using a material having heat resistance that can withstand the heat treatment. For example, the heat resistance to the temperatures of about the strain point of the base substrate 110 to which is later fixed is necessary.

The surface of the first electrode 114 preferably has an average surface roughness (Ra) of 0.5 nm or less, more preferably 0.3 nm or less. Needless to say, the Ra is preferably smaller. When the smoothness of the surface of the first electrode 114 is favorable, it is possible to attach favorably the first electrode 114 to the base substrate 110 later. Note that the average surface roughness (Ra) in this specification refers to centerline average roughness defined according to JIS B0601 which is expanded three dimensionally so as to correspond to a plane.

Figure 3D:
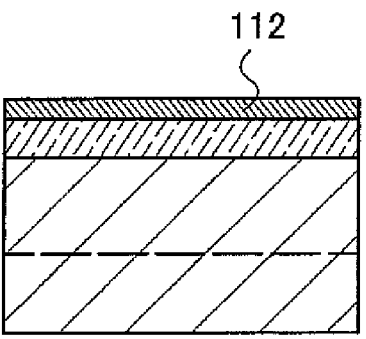

The insulating layer 112 is formed over the first electrode 114 (see FIG. 3D).

The insulating layer 112 can have a single-layer structure or a stacked structure including two or more layers. In any case, the plane which forms a bonding (the bonding plane) by attachment to the base substrate 110 later preferably has favorable smoothness, and more preferably the surface has a hydrophilic property. Specifically, when the insulating layer 112 is formed so that the average surface roughness Ra of the bonding plane is 0.5 nm or less, preferably 0.3 nm or less, the attachment with the base substrate 110 can be performed favorably. Needless to say, the average surface roughness (Ra) is preferably small.

For example, as a layer that forms the bonding plane of the insulating layer 112, a silicon oxide layer, a silicon nitride layer, a silicon oxynitride layer, a silicon nitride oxide layer, or the like is formed by a CVD method such as a plasma CVD method, a photo CVD method, or a thermal CVD method (including a reduced-pressure CVD method and an atmospheric pressure CVD method). A plasma CVD method is preferable in the formation of the insulating layer 112 because a layer with favorable smoothness can be formed.

Specifically, as for a layer which has a smooth surface and which can form a hydrophilic surface, a silicon oxide layer formed by a plasma CVD method using organosilane gas is preferable. The bonding with the substrate can be strengthened by the use of such a silicon oxide layer. As the organosilane gas, any of the following silicon-containing compounds may be used: tetraethoxysilane (TEOS: chemical formula: $Si(OC_2H_5)_4$), tetramethylsilane (TMS: chemical formula: $Si(CH_3)_4$), tetramethylcyclotetrasiloxane (TMCTS), octamethylcyclotetrasiloxane (OMCTS), hexamethyldisilazane (HMDS), triethoxysilane ($SiH(OC_2H_5)_3$), and trisdimethylaminosilane ($SiH(N(CH_3)_2)_3$).

Further, for the layer which has a smooth surface and which can form a hydrophilic surface, a layer of silicon oxide, silicon oxynitride, silicon nitride, or silicon nitride oxide which is formed by a plasma CVD method using a silane-based gas such as silane, disilane, or trisilane can be used. For example, as the layer that forms the bonding plane of the insulating layer 112, a silicon nitride layer formed by a plasma CVD method using silane and ammonia as a source gas can be used. Note that hydrogen may be added to the source gas including silane and ammonia; alternatively, dinitrogen monoxide may be added to the source gas so that a silicon nitride oxide layer is formed. When at least one layer included in the insulating layer 112 is a silicon insulating layer containing nitrogen, specifically a silicon nitride layer or a silicon nitride oxide layer, diffusion of impurities from the base substrate 110 which is later attached can be prevented.

In any case, the insulating layer 112 is not limited to an insulating layer containing silicon, as long as the insulating layer 112 has a smooth bonding plane, specifically, the insulating layer 112 has a smooth bonding plane with an average surface roughness (Ra) of 0.5 nm or less, preferably 0.3 nm or less. Note that in the case where the insulating layer 112 has a stacked structure, the layers except the layer which forms the bonding plane are not limited thereto. In this embodiment, moreover, the insulating layer 112 needs to be formed at a temperature at which the embrittlement layer 105 formed in the single-crystal semiconductor substrate 101 does not change, preferably at 350° C. or lower.

Figure 8:
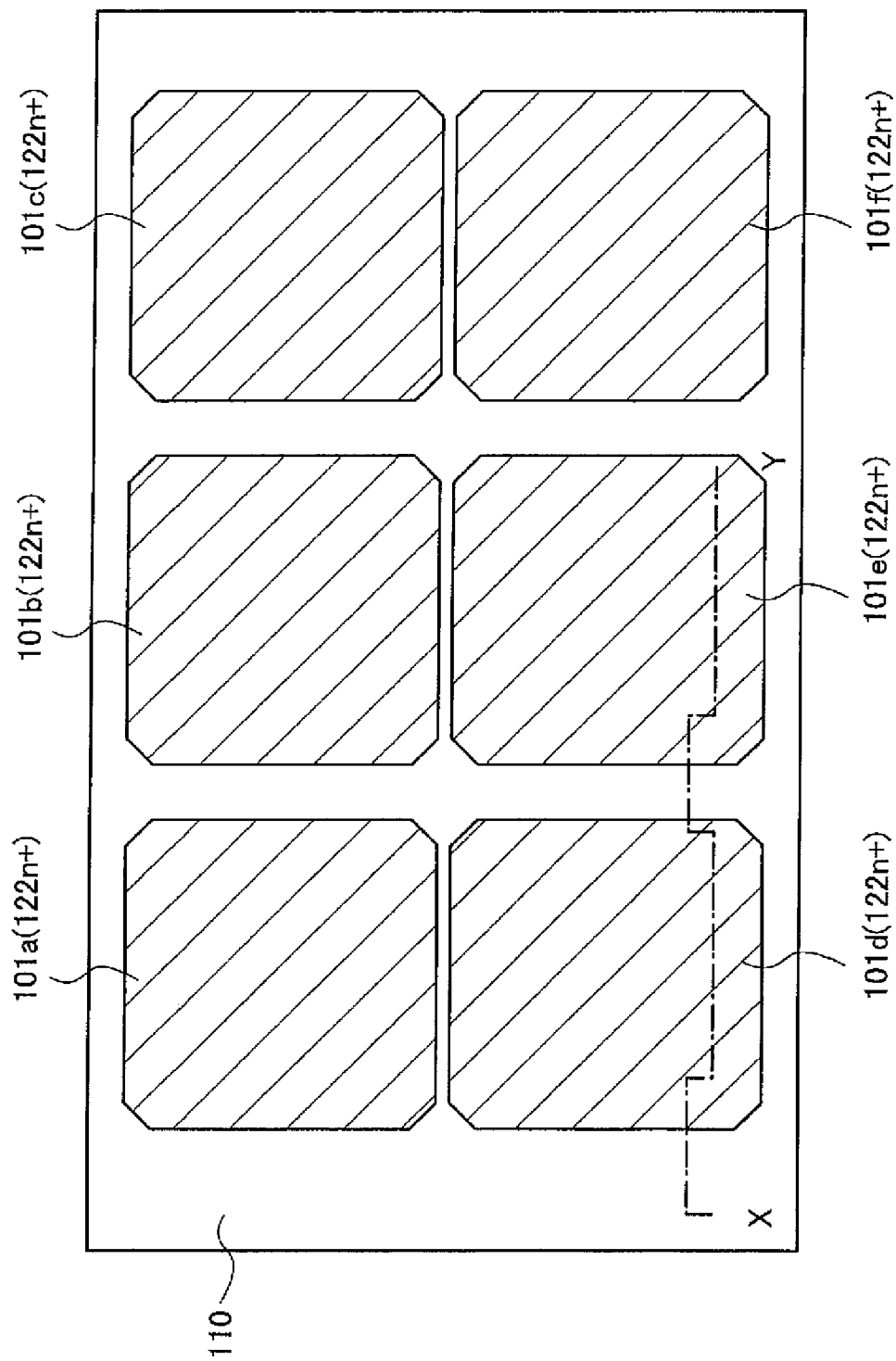
FIG. 8 is a plan view illustrating a manufacturing method of a photoelectric conversion device module according to one embodiment of the present invention.

One surface of the single-crystal semiconductor substrate 101 and one surface of the base substrate 110 are superposed and attached. In one embodiment of the present invention, a photoelectric conversion device module in which a plurality of photoelectric conversion cells are provided on one substrate is manufactured. A plurality of single-crystal semiconductor substrates 101 are attached to the base substrate 110 with a predetermined interval therebetween. FIG. 8 illustrates a case where six single-crystal semiconductor substrates 101 are arranged with a predetermined interval therebetween over one base substrate 110 as an example. Here, for descriptive purposes, the six single-crystal semiconductor substrates 101 are referred to as a single-crystal semiconductor substrate 101a, a single-crystal semiconductor substrate 101b, a single-crystal semiconductor substrate 101c, a single-crystal semiconductor substrate 101d, a single-crystal semiconductor substrate 101e, and a single-crystal semiconductor substrate 101f.

Figure 4A:
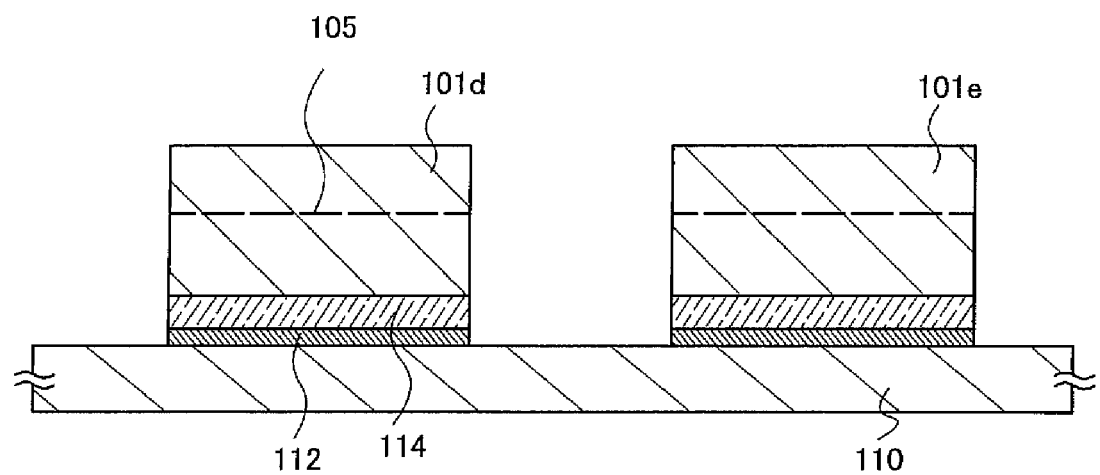
FIGS. 4A and 4B are cross-sectional views illustrating a manufacturing method of a photoelectric conversion device module according to one embodiment of the present invention.

FIG. 4A corresponds to a cross section taken along the section line X-Y in FIG. 8, and the single-crystal semiconductor substrates 101d and 101e attached to the base substrate 110 are illustrated. The interval between the adjacent single-crystal semiconductor substrates (e.g., the single-crystal semiconductor substrates 101d and 101e) is about 1 mm (see FIG. 4A and FIG. 8).

The bonding plane of the single-crystal semiconductor substrate 101 (the single-crystal semiconductor substrates 101a to 101f) and the bonding plane of the base substrate 110 are brought into contact with each other and the bonding is formed by van der Waals forces or hydrogen bonding. A surface of the insulating layer 112 formed over the single-crystal semiconductor substrate 101 and one surface of the base substrate 110 are attached and bonded. For example, the base substrate 110 and the single-crystal semiconductor substrates 101 (the single-crystal semiconductor substrates 101a to 101f) which are superimposed are pressed at one place, whereby van der Waals forces or hydrogen bonding can be spread to the entire area of the bonding planes. When one or both of the bonding planes have hydrophilic surfaces, hydroxyl groups or water molecules serve as an adhesive and water molecules diffuse in later heat treatment; then, the remaining composition forms silanol groups (Si—OH) and the bonding is formed by hydrogen bonding. Further, this bonding portion forms a siloxane bonding (O—Si—O) by release of hydrogen to become a covalent bond, which forms a stronger bonding.

The bonding plane of the single-crystal semiconductor substrate 101 and the bonding plane of the base substrate 110 each preferably have an average surface roughness (Ra) of 0.5 nm or less, more preferably 0.3 nm or less. Further, the sum of the average surface roughness (Ra) of the bonding plane of the single-crystal semiconductor substrate 101 and the bonding plane of the base substrate 110 is 0.7 nm or less, preferably 0.6 nm or less, more preferably 0.4 nm or less. The bonding plane of the single-crystal semiconductor substrate 101 and the bonding plane of the base substrate 110 each have a contact angle to pure water of 20° or less, preferably 10° or less, more preferably 5° or less. The total contact angle to pure water of the bonding plane of the single-crystal semiconductor substrate 101 and the bonding plane of the base substrate 110 is 30° or less, preferably 20° or less, more preferably 10° or less. If the bonding planes are attached under the above conditions, they are attached in a favorable manner, whereby the bonding can be further strengthened.

Prior to the attachment of the single-crystal semiconductor substrate 101 and the base substrate 110, the bonding plane of each of the single-crystal semiconductor substrate 101 and the base substrate 110 is preferably cleaned sufficiently in advance. This prevents particles such as microscopic dust on the bonding plane from causing a defect in attachment. For example, the bonding planes are cleaned preferably by ultrasonic cleaning using pure water and ultrasonic wave with a frequency of 100 kHz to 2 MHz, megasonic cleaning, or two fluid cleaning with pure water, nitrogen, and dry air. Further, carbon dioxide or the like may be added to pure water which is used for the cleaning so that the resistivity is reduced to be 5 MΩcm or less to prevent generation of static electricity.

Note that the attachment may be performed after the bonding planes are irradiated with an atomic beam or an ionic beam or the bonding planes are subjected to plasma treatment or radical treatment. Through the treatment as above, the bonding planes can be activated so that the attachment can be performed favorably. For example, the bonding plane can be activated by being irradiated with an inert gas neutral atomic beam of argon or an inert gas ion beam of argon or the like or activated by being exposed to oxygen plasma, nitrogen plasma, oxygen radicals, or nitrogen radicals. By the activation of the bonding planes, the bonding can be formed at low temperatures (for example, 400° C. or less) even between bases that contain different materials, such as an insulating layer and a glass substrate. Further, the bonding can be strengthened when the bonding plane is processed using ozone-added water, oxygen-added water, hydrogen-added water, pure water, or the like so that the bonding surface is hydrophilic and the number of hydroxyls on the bonding plane is increased.

In this embodiment, a plurality of single-crystal semiconductor substrates 101 are arranged on one base substrate 110. In this case, a batch system or a single wafer system may be employed for arrangement of the single-crystal semiconductor substrates over the base substrate. For example, a plurality of single-crystal semiconductor substrates can be arranged at one time using a holding means such as a tray or substrates can be arranged one by one. Preferably, a desired number of single-crystal semiconductor substrates are held by a holding means so as to be arranged with a predetermined interval over the base substrate, and arranged at one time, which leads to improvement of productivity. Further, by making the shape of a holding means so as to correspond to arrangement of single-crystal semiconductor substrates with a predetermined interval in advance, alignment of the single-crystal semiconductor substrates and the base substrate becomes easy, which is preferable. Needless to say, single-crystal semiconductor substrates may be arranged over a base substrate while they are aligned one by one. The holding means of the single-crystal semiconductor substrates may be a tray, a substrate for holding, a vacuum chuck or an electrostatic chuck.

After the single-crystal semiconductor substrate 101 and the base substrate 110 are superposed on each other, heat treatment and/or pressure treatment is preferably performed. Heat treatment and/or pressure treatment can increase the bonding strength. When the heat treatment is performed, the temperature of the heat treatment is set at less than or equal to the strain point of the base substrate 110 and at a temperature at which the volume of the embrittlement layer 105 formed in the single-crystal semiconductor substrate 101 does not change, preferably at a temperature higher than or equal to 200° C. and lower than 410° C. This heat treatment is preferably performed in succession in the apparatus or at the place where the attachment is performed. In the case of performing the pressure treatment, pressure is applied to the bonding planes in a vertical direction in consideration of the pressure resistance of the base substrate 110 and the single-crystal semiconductor substrate 101. In succession to the heat treatment for increasing the bonding strength, another heat treatment for separating the single-crystal semiconductor substrates 101 with the embrittlement layer 105 as a boundary, which is described later, may be performed.

Alternatively, an insulating layer such as a silicon oxide layer, a silicon nitride layer, a silicon oxynitride layer, or a silicon nitride oxide layer may be formed over the base substrate 110 side, so that the base substrate 110 is attached to the single-crystal semiconductor substrate 101 with the insulating layer interposed therebetween. For example, the insulating layer formed over the base substrate 110 side and the insulating layer formed on the single-crystal semiconductor substrate 101 side can serve as the bonding planes which are attached to each other.

Figure 4B:
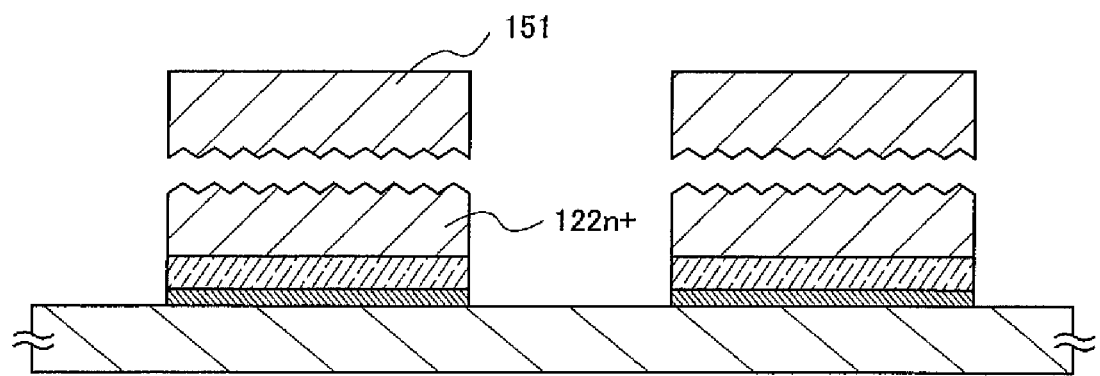

The single-crystal semiconductor substrate 101 is sliced so that the superficial layer thereof is separated; thus, the single-crystal semiconductor layer is formed over the base substrate 110 (FIG. 4B). In this embodiment, a high-concentration n-type single-crystal semiconductor substrate is used as the single-crystal semiconductor substrate 101. Thus, the separated single-crystal semiconductor layer itself can function as an impurity semiconductor layer to form a semiconductor junction. Here, an n-type first impurity semiconductor layer 122n+ is formed using an n-type single-crystal semiconductor layer separated from the n-type single-crystal semiconductor substrate 101 of the first conductivity. In this embodiment, the high-concentration n-type single-crystal semiconductor substrate 101 is used, and thus an n+ first impurity semiconductor layer 122n+ is formed. As illustrated in FIG. 8, the single-crystal semiconductor substrates 101a to 101f are arranged on one base substrate 110, and a plurality of stack bodies in which the insulating layer 112, the first electrode 114, and the first impurity semiconductor layer 122n+ (single-crystal semiconductor layer) are stacked are formed corresponding to the arrangement of the single-crystal semiconductor substrates 101a to 101f.

In the case where the embrittlement layer 105 is formed as in this embodiment, the single-crystal semiconductor substrate 101 can be separated with the embrittlement layer 105 as a boundary. In addition, the single-crystal semiconductor substrate 101 can be separated by heat treatment. The heat treatment can be performed by, rapid thermal annealing (RTA), furnace, a heat treatment apparatus using dielectric heating with use of a high frequency wave such as a microwave or a millimeter wave generated in a high-frequency generator. As a heating method of the heat treatment apparatus, a resistance heating method, a lamp heating method, a gas heating method, an electromagnetic wave heating method, or the like can be given. Laser irradiation or heat plasma jetting may be conducted. An RTA apparatus can heat an object rapidly, and can heat the single-crystal semiconductor substrate 101 up to a temperature about or at the melting point of the single-crystal semiconductor substrate 101 or at a temperature around or slightly higher than a strain point of the base substrate 110. The suitable temperature in the heat treatment for dividing the single-crystal semiconductor substrate 101 is higher than or equal to 410° C. and lower than the stain point of the single-crystal semiconductor substrate 101 (and lower than the strain point of the base substrate 110). By the heat treatment performed at least at 410° C., there is a change in the volume of the microvoids in the embrittlement layer 105 so that the single-crystal semiconductor substrate 101 can be divided in or near the embrittlement layer 105.

In the heat treatment for separation, the impurity element in the first impurity semiconductor layer 122n+ can be activated.

For example, the thickness of the first impurity semiconductor layer 122n+ layer separated from the single-crystal semiconductor substrate 101 can be from 20 nm to 1000 nm, preferably 40 nm to 300 nm. Naturally, a single-crystal semiconductor layer having a thickness equal to or larger than the above thickness can be separated from the single-crystal semiconductor substrate 101 by adjusting the acceleration voltage in forming the embrittlement layer.

The single-crystal semiconductor substrate 101 is divided with the embrittlement layer 105 as a boundary, whereby the first impurity semiconductor layer 122n+ which is a single-crystal semiconductor layer can be separated from the single-crystal semiconductor substrate 101. Thus, a separation substrate 151, that is, the single-crystal semiconductor substrate 101 from which the single-crystal semiconductor layer 122n+ is separated, is obtained. The separation substrate 151 which is single-crystal semiconductor can be reused repeatedly after being reprocessed. The separation substrate 151 may be reused as a single-crystal semiconductor substrate for forming a photoelectric conversion device, or may be used for other purposes. By repeating the recycle of using the separation substrate 151 as the single-crystal semiconductor substrate from which a single-crystal semiconductor layer is separated, it is possible to manufacture a plurality of photoelectric conversion devices (photoelectric conversion cells) from one single-crystal semiconductor substrate which serves as a source material.

Due to the division of the single-crystal semiconductor substrate 101 with the embrittlement layer 105 as a boundary, the division plane (separation plane) of the sliced single-crystal semiconductor layer (here the first impurity semiconductor layer 122n+) is uneven in some cases. The unevenness of the separation plane has an influence on layers that are stacked over the first impurity semiconductor layer 122n+ which is a single-crystal semiconductor layer, so that the light incidence plane of a completed photoelectric conversion device can have an uneven structure. The unevenness on the light incidence plane side can serve as a surface texture, which can improve the light absorptance. By the irradiation with the ions accelerated by voltage and the separation through the heat treatment as above, the surface texture structure can be formed without chemical etching or the like. As a result, an improvement in photoelectric conversion efficiency can be achieved while the cost is reduced and the process is shortened.

Figure 5A:
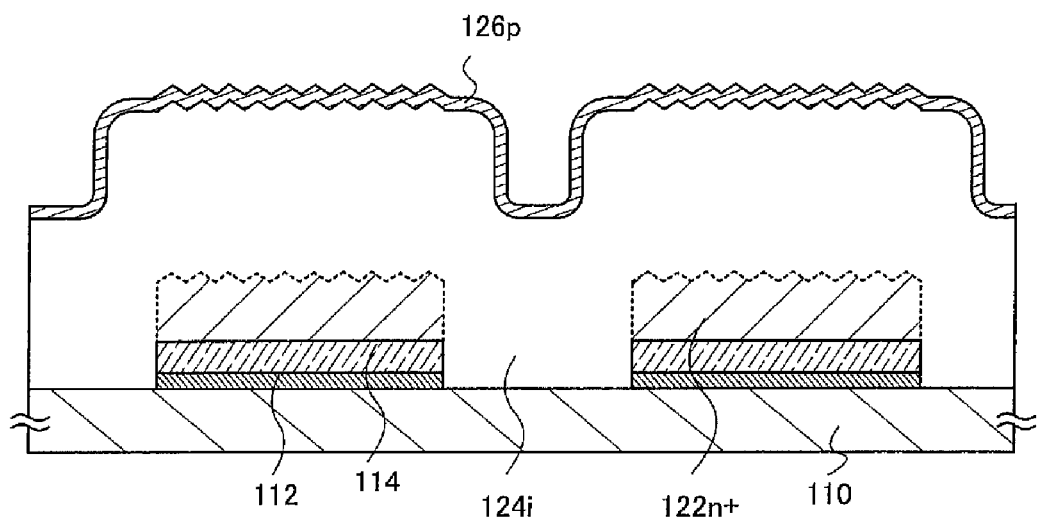
FIGS. 5A and 5B are cross-sectional views illustrating a manufacturing method of a photoelectric conversion device module according to one embodiment of the present invention.

The single-crystal semiconductor layer 124i is formed over the first impurity semiconductor layer 122n+ layer (FIG. 5A).

As the single-crystal semiconductor layer exhibiting a photoelectric effect, a single-crystal semiconductor layer having a desired thickness may be separated from a single-crystal semiconductor substrate by slicing, but the thickness of the single-crystal semiconductor layer is preferably increased by an epitaxial growth method such as solid phase epitaxy or vapor phase epitaxy.

Since single-crystal silicon as a typical example of a single-crystal semiconductor is an indirect transition semiconductor, its light absorption coefficient is low. Accordingly, single-crystal silicon should be several times or more times thick as amorphous silicon or microcrystal silicon in order to absorb sufficient solar light. In a case of employing a tandem type structure of single-crystal silicon and non-single-crystal silicon, single-crystal silicon should be thicker than non-single-crystal silicon. Here, the total thickness of the single-crystal semiconductor layer 124i and the first impurity semiconductor layer 122n+ which is a single-crystal semiconductor layer is from 1 µm to 10 µm, preferably from 2 µm to 8 µm.

In a case of slicing a single-crystal semiconductor substrate by an ion implantation separation method or an ion doping method using ions typified by hydrogen ions, acceleration voltage should be increased in order to increase the thickness of the single-crystal semiconductor layer separated. However, increase in the acceleration voltage of an ion implantation apparatus or an ion doping apparatus has limitation based on the aspect of the apparatus, or radiation rays which are safety hazard might be generated due to increase of the acceleration voltage. Further, in a case of a conventional apparatus, since it is difficult to perform irradiation with a large amount of ions with the acceleration voltage increased, a long period of time is necessary for obtaining a predetermined amount of ions implanted, which results in longer takt time.

The above safety hazard can be avoided by employing an epitaxial growth method. Further, the single-crystal semiconductor substrate as a source material can be left thick, and the number of reusing it is increased, which leads to resource saving.

A single-crystal semiconductor layer that is single-crystallized is formed over at least stacked bodies so that the plural stacked bodies (including the insulating layer 112, the first electrode 114 and the first impurity semiconductor layer 122n+) and a space between the adjacent stacked bodies are covered with the single-crystal semiconductor layer. Here the first impurity semiconductor layer 122n+ is referred to as a first single-crystal semiconductor layer and the single-crystal semiconductor layer formed over each of the stacked bodies is referred to as a second single-crystal semiconductor layer. The second single-crystal semiconductor layer is formed by epitaxial growth using the first single-crystal semiconductor layer as a seed layer.

Specifically, a non-single-crystal semiconductor layer is formed entirely over the substrate so as to cover the plurality of stacked bodies and the space between stacked bodies. The plurality of stacked bodies are arranged over the base substrate 110 with a predetermined interval as illustrated in FIG. 8, and the non-single-crystal semiconductor layer is formed so as to cover the plurality of stacked bodies. By heat treatment, the single-crystal semiconductor layer 124i can be formed by solid phase epitaxial growth of the non-single-crystal semiconductor layer.

The non-single-crystal semiconductor layer is formed by a chemical vapor deposition method typified by a plasma CVD method. A microcrystal semiconductor or an amorphous semiconductor can be formed by changing flow rates of gases of a reaction gas to form the non-single-crystal semiconductor layer, power to be applied, or the like. For example, the flow rate of the dilution gas (e.g., hydrogen) to a semiconductor source gas (e.g., silane) is from 10:1 to 2000:1, preferably from 50:1 to 200:1 so that a micro crystal semiconductor layer (typically, a micro crystal silicon layer) can be formed. The flow rate of the dilution gas to the semiconductor source gas is less than 10 times (less than 10:1) so that an amorphous semiconductor layer (typically an amorphous silicon layer) can be formed. In addition, by mixing a doping gas into a mixture gas, an n-type or p-type non-single-crystal semiconductor layer is formed and solid-grown so that an n-type or p-type single-crystal semiconductor layer can be formed.

Preferably, a first semiconductor layer having high crystallinity (e.g., a semiconductor layer formed under formation conditions for a micro crystal semiconductor) is formed thin as the non-single-crystal semiconductor layer, and then a second semiconductor layer (e.g., a semiconductor layer whose deposition rate is higher than that of the first semiconductor layer or a semiconductor layer formed under formation conditions for an amorphous semiconductor layer) having crystallinity lower than the first semiconductor layer is formed thick and subjected to solid phase growth by heat treatment. By employing such a structure for the non-single-crystal semiconductor layer, a problem of peeling or the like due to a large amount of content of hydrogen included in the semiconductor layer that has been just formed can be prevented. Note that the first semiconductor layer having high crystallinity is greatly subjected to influence of crystallinity of the first impurity semiconductor layer $122n+$ which is a single-crystal semiconductor layer formed by slicing, and may be subjected to vapor phase growth. However, the crystallinity of the first semiconductor layer is not limited to single crystal as long as the crystallinity of the semiconductor layer is higher than that of the second semiconductor layer with low crystallinity formed later.

Heat treatment for solid phase growth can be conducted with a heat treatment apparatus such as RTA, furnace, or a high-frequency generation apparatus. In the case of using an RTA apparatus, preferably, the process temperature is from 500° C. to 750° C., and the process time is from 0.5 minute to 10 minutes. In the case of using a furnace, preferably, the process temperature is from 500° C. to 650° C., and the process time is from 1 hour to 4 hours.

In addition, a semiconductor layer is formed over the first impurity semiconductor layer $122n+$ which is a single-crystal semiconductor layer under predetermined conditions by a plasma CVD method, whereby vapor phase growth can be performed at the same time as the deposition of the semiconductor layer to form the single-crystal semiconductor layer $124i$.

The conditions of plasma CVD for vapor phase depend on the flow rates of gases included in a reaction gas, power to be applied, or the like. For example, in an atmosphere including a semiconductor source gas (silane) and a dilution gas (hydrogen), the flow rate ratio of the dilution gas to the semiconductor source gas is 6 or more:1, preferably 50 or more:1, so that the single-crystal semiconductor layer $124i$ can be formed. By mixing a doping gas into the reaction gas, an n-type or p-type single-crystal semiconductor layer can be formed by vapor phase growth. The flow rate of the dilution gas may be changed halfway during the progress of the formation process of the single-crystal semiconductor layer $124i$. For example, just after the formation started, a thin semiconductor layer is formed at the flow rate ratio of hydrogen to silane: about 150:1, and then a thick semiconductor layer is formed at the flow rate ratio of hydrogen to silane: about 6:1, so that the single-crystal semiconductor layer $124i$ can be formed. Just after the formation started, a thin semiconductor layer is formed under a condition where the semiconductor source gas is diluted by the dilution gas at a high dilution ratio, and then a thick semiconductor layer is formed under a condition where the semiconductor source gas is diluted by the dilution gas at a low dilution ratio, so that film peeling can be prevented and the deposition rate can be increased for vapor phase growth.

As illustrated in FIG. 8, a plurality of stacked bodies (first impurity semiconductor layers $122n+$) are arranged over the base substrate 110 with a predetermined interval therebetween, and no seed layer exists between adjacent stacked bodies. The crystal growth of the single-crystal semiconductor layer $124i$ of this embodiment may proceed at least on the stacked bodies (the first impurity semiconductor layer $122n+$), and the crystal state of the space between the stacked bodies is not especially limited.

The second impurity semiconductor layer $126p$ of the second conductivity type is formed over the single-crystal semiconductor layer $124i$ (FIG. 5A).

As the second impurity semiconductor layer $126p$, a semiconductor layer including an impurity element imparting a conductivity type opposite to that of the first impurity semiconductor layer $122n+$ is formed by a plasma CVD method or the like. Alternatively, an impurity element imparting a conductivity type opposite to that of the first impurity semiconductor layer $122n+$ is introduced to the surface side of the single-crystal semiconductor layer $124i$ by an ion doping method, an ion implantation method or a laser doping method so that the second impurity semiconductor layer $126p$ can be formed.

Before forming the second impurity semiconductor layer $126p$ by a plasma CVD method or the like, a material layer (e.g., a native oxide layer formed on the single-crystal semiconductor layer $124i$) that is different from the semiconductor is removed. The native oxide layer can be removed by wet etching with use of hydrofluoric acid or dry etching. In addition, when the second impurity semiconductor layer $126p$ is formed, plasma treatment can be conducted by plasma treatment using a mixture gas of hydrogen and a rare gas, e.g., a mixture gas of hydrogen and helium or a mixture gas of hydrogen, helium and argon to remove a native oxide layer or an atmospheric element (such as oxygen, nitrogen or carbon) before introducing a semiconductor source gas.

In this embodiment, the p-type second impurity semiconductor layer $126p$ is formed. Specifically, the p-type second impurity semiconductor layer $126p$ is formed by a plasma CVD method using a reaction gas containing a doping gas imparting a p-type conductivity type (e.g., diborane).

Through the steps up to this point, a first photoelectric conversion layer in which the first impurity semiconductor layer $122n+$ (the first single-crystal semiconductor layer), the single-crystal semiconductor layer $124i$ (the second single-crystal semiconductor layer) and the second impurity semiconductor layer are stacked is formed. In this embodiment, the first impurity semiconductor layer $122n+$, the single-crystal semiconductor layer $124i$ and the second impurity semiconductor layer are stacked to form an nip junction. Alternatively, the n-type and the p-type are replaced with each other to form a pin junction in the first photoelectric conversion layer.

Figure 5B:
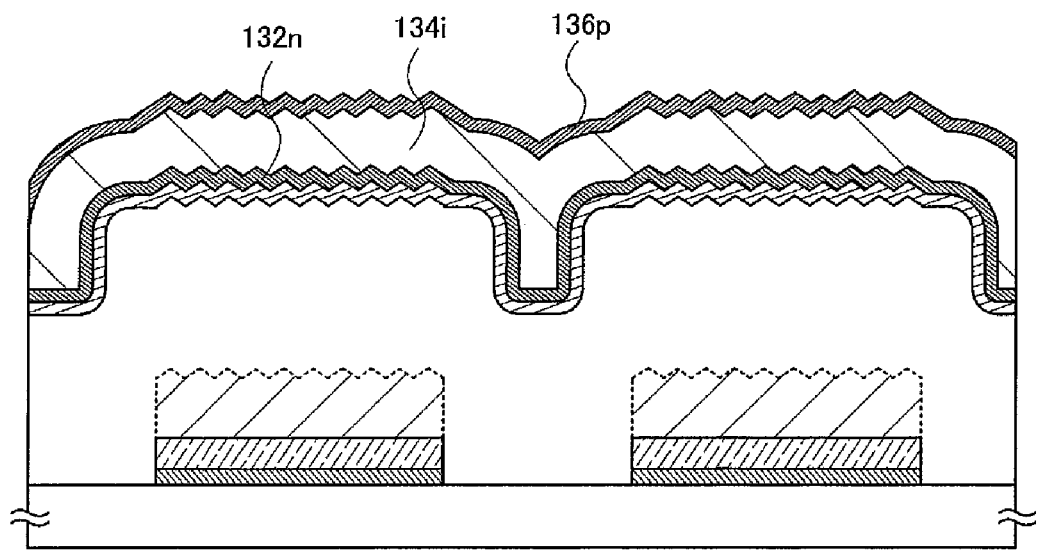

The third impurity semiconductor layer $132n$ having the first conductivity type, the non-single-crystal semiconductor layer $134i$, and the fourth impurity semiconductor layer $136p$ having the second conductivity type are formed over the second impurity semiconductor layer $126p$ (FIG. 5B).

As the third impurity semiconductor layer $132n$, a semiconductor layer including an impurity element imparting a conductivity type opposite to that of the second impurity semiconductor layer $126p$ is formed by a plasma CVD method or the like. In this embodiment, a micro crystal semiconductor layer including an impurity element imparting an n-type conductivity (e.g., phosphorus) is formed by a plasma CVD method to form the n-type third impurity semiconductor layer $132n$.

As the non-single-crystal semiconductor layer $134i$, an amorphous semiconductor layer (typically, amorphous silicon) or a micro crystal semiconductor layer (typically micro crystal silicon) is formed by a chemical vapor deposition method typified by a plasma CVD method. In this embodiment, the intrinsic or substantially-intrinsic non-single-crystal semiconductor layer 134i is formed.

As the fourth impurity semiconductor layer 136p, a semiconductor layer including an impurity element imparting a conductivity opposite to that of the third impurity semiconductor layer 132n is formed by a plasma CVD method or the like. In this embodiment, a micro crystal semiconductor layer including an impurity element imparting a p-type conductivity (e.g., boron) is formed by a plasma CVD method to form the p-type fourth impurity semiconductor layer 136p.

Through the steps up to this point, a second photoelectric conversion layer in which the third impurity semiconductor layer 132n, the non-single-crystal semiconductor layer 134i and the fourth impurity semiconductor layer 136p are stacked is formed. In this embodiment, the third impurity semiconductor layer 132n, the non-single-crystal semiconductor layer 134i and the fourth impurity semiconductor layer 136p are stacked to form an nip junction. Alternatively, the n-type and the p-type are replaced with each other to form a pin junction in the second photoelectric conversion layer.

Figure 6A:
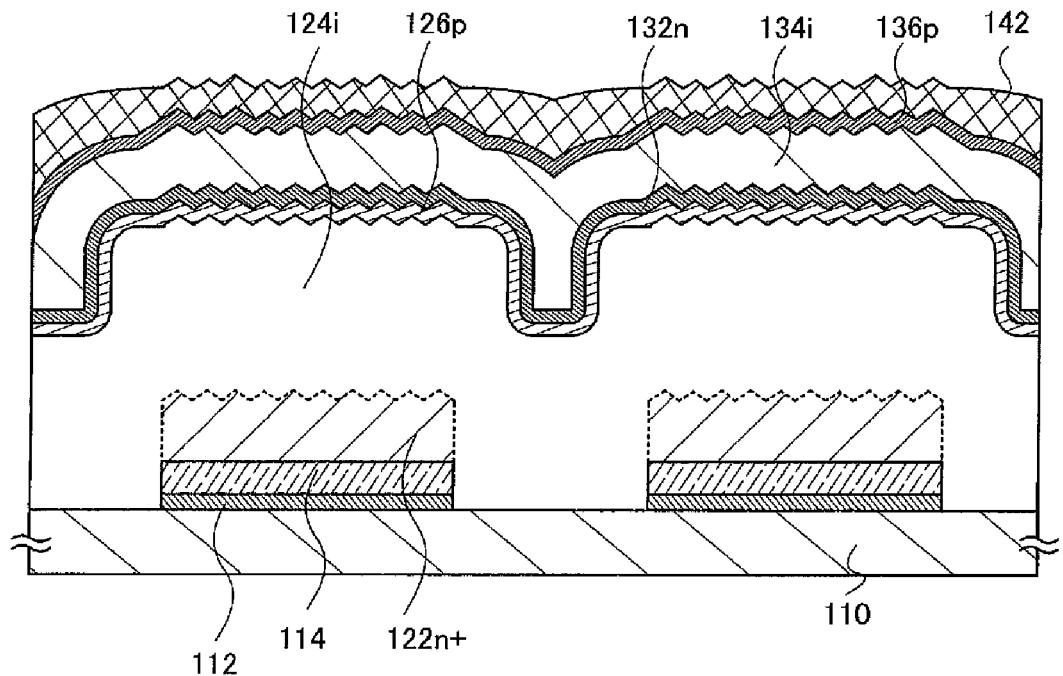
FIGS. 6A and 6B are cross-sectional views illustrating a manufacturing method of a photoelectric conversion device module according to one embodiment of the present invention.

The second electrode 142 is formed over the fourth impurity semiconductor layer 136p (see FIG. 6A).

In this embodiment, the second electrode 142 side is the light incidence plane; therefore, the second electrode 142 is formed using a transparent conductive material by a sputtering method or a vacuum evaporation method. As the transparent conductive material, metal oxide such as indium tin oxide (ITO) alloy, zinc oxide, tin oxide, an alloy of indium oxide and zinc oxide, or the like is used. As an alternative to the transparent conductive material such as metal oxide, a conductive high molecular material (also referred to as a conductive polymer) can be used. As the conductive high molecular material, a π electron conjugated conductive high molecule can be used. For example, polyaniline and/or a derivative thereof, polypyrrole and/or a derivative thereof, polythiophene and/or a derivative thereof, a copolymer of two or more kinds of those materials, and the like are given. In the case of using a conductive high molecular material, the conductive high molecule is dissolved in a solvent and the second electrode 142 can be formed with the solvent by a wet process such as an application method, a coating method, a droplet discharging method, or a printing method.

Figure 6B:
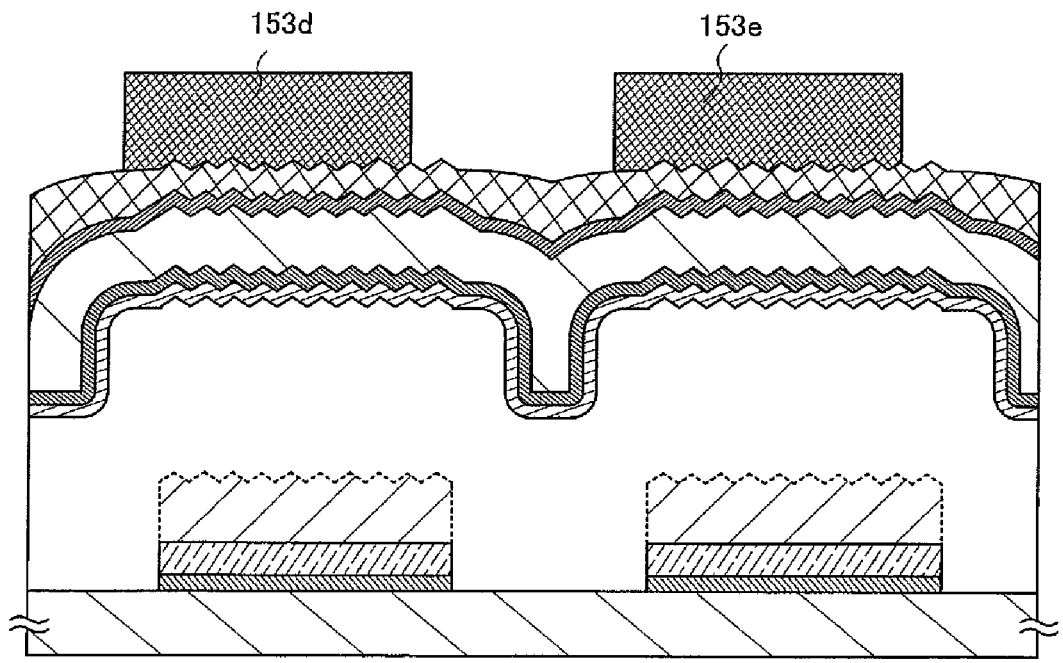

For element-separation of the photoelectric conversion cells, a mask is formed over the second electrode 142 (FIG. 6B).

Figure 9:
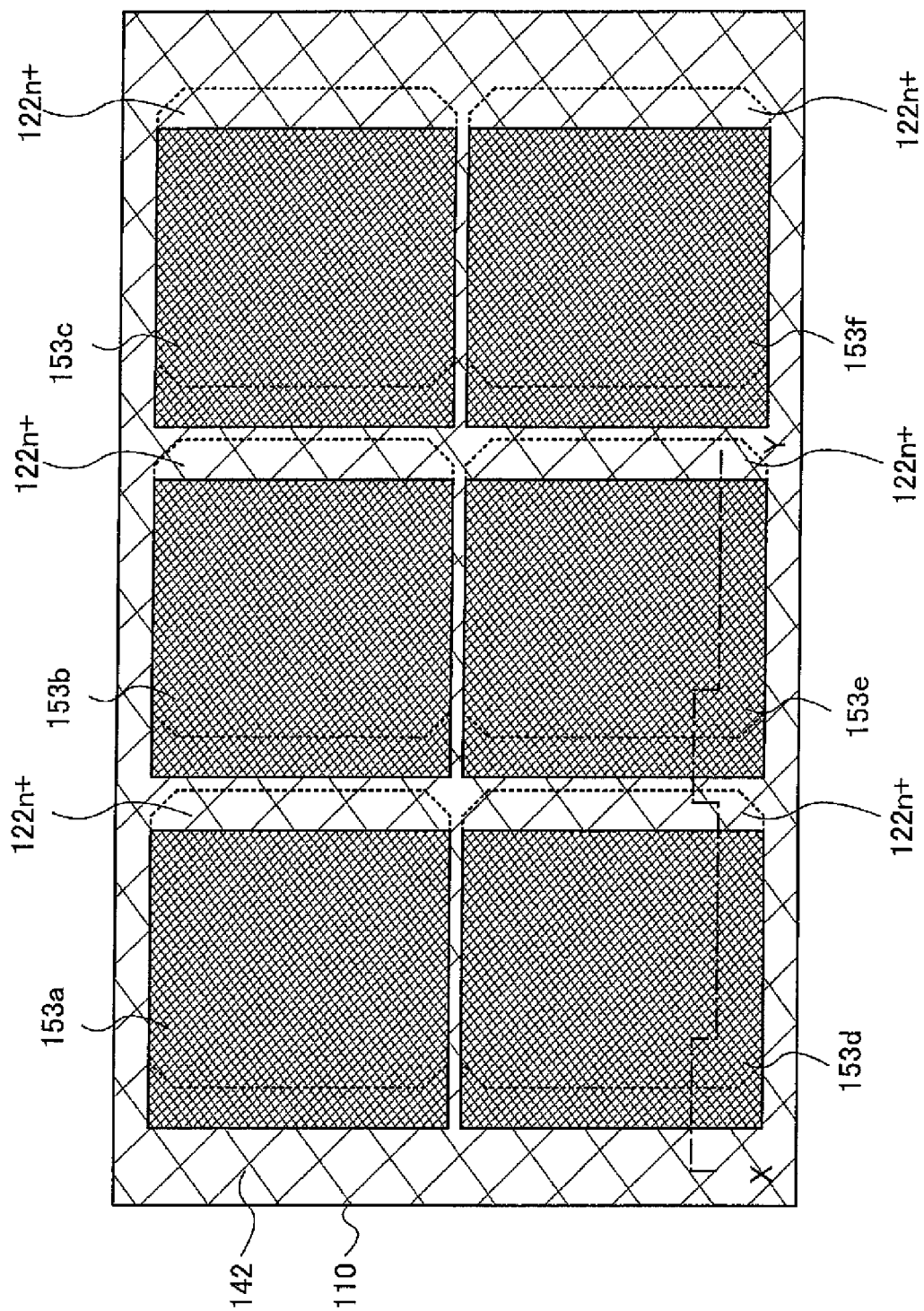
FIG. 9 is a plan view illustrating a manufacturing method of a photoelectric conversion device module according to one embodiment of the present invention.

Through the manufacturing process up to this point, the semiconductor layer is stacked over the plurality of stacked bodies (stacked structure in which the insulating layer 112, the first electrode 114 and the impurity semiconductor layer 122n+ are stacked in this order) which are arranged with a predetermined interval therebetween. The semiconductor layer is separated so as to correspond to each photoelectric conversion cell to make a module. Specifically, sectioning for element separation is conducted at the space between adjacent stacked bodies. In addition, for electrical connection between the photoelectric conversion cells and for prevention of short-circuiting of photoelectric conversion cells due to the contact of the first electrode 114 and a connecting electrode to be formed later, the element separation is conducted such that the plurality of stacked bodies can each have an exposed part and an unexposed part in an end portion of the first electrode 114. In this case, resist masks 153a, 153b, 153c, 153d, 153e and 153f are formed in regions almost overlapping with the stacked bodies (the first impurity semiconductor layers 122n+) by a photolithography method and an etching method as illustrated in FIG. 9. Note that the resist masks 153a to 153e are provided to partially expose the stacked bodies (the first impurity semiconductor layers 122n+). For example, the end portion of the first electrode 114 included in one of the adjacent stacked bodies is exposed, and an end portion of the first electrode 114 included in the other of the adjacent stacked bodies is covered with the resist mask.

Figure 7A:
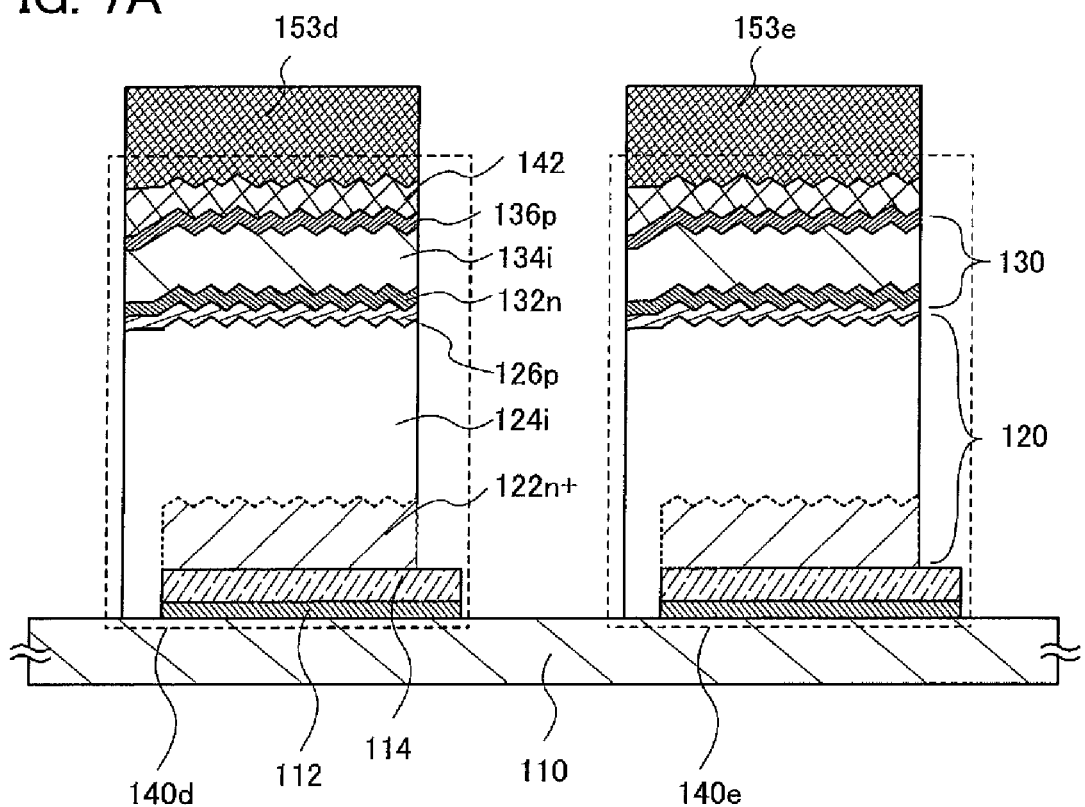
FIGS. 7A and 7B are cross-sectional views illustrating a manufacturing method of a photoelectric conversion device module according to one embodiment of the present invention.

The first unit cell 120, the second unit cell 130 and the second electrode 142 provided over the first electrode 114 are selectively etched to form element-separated photoelectric conversion cells (FIG. 7A).

Figure 10:
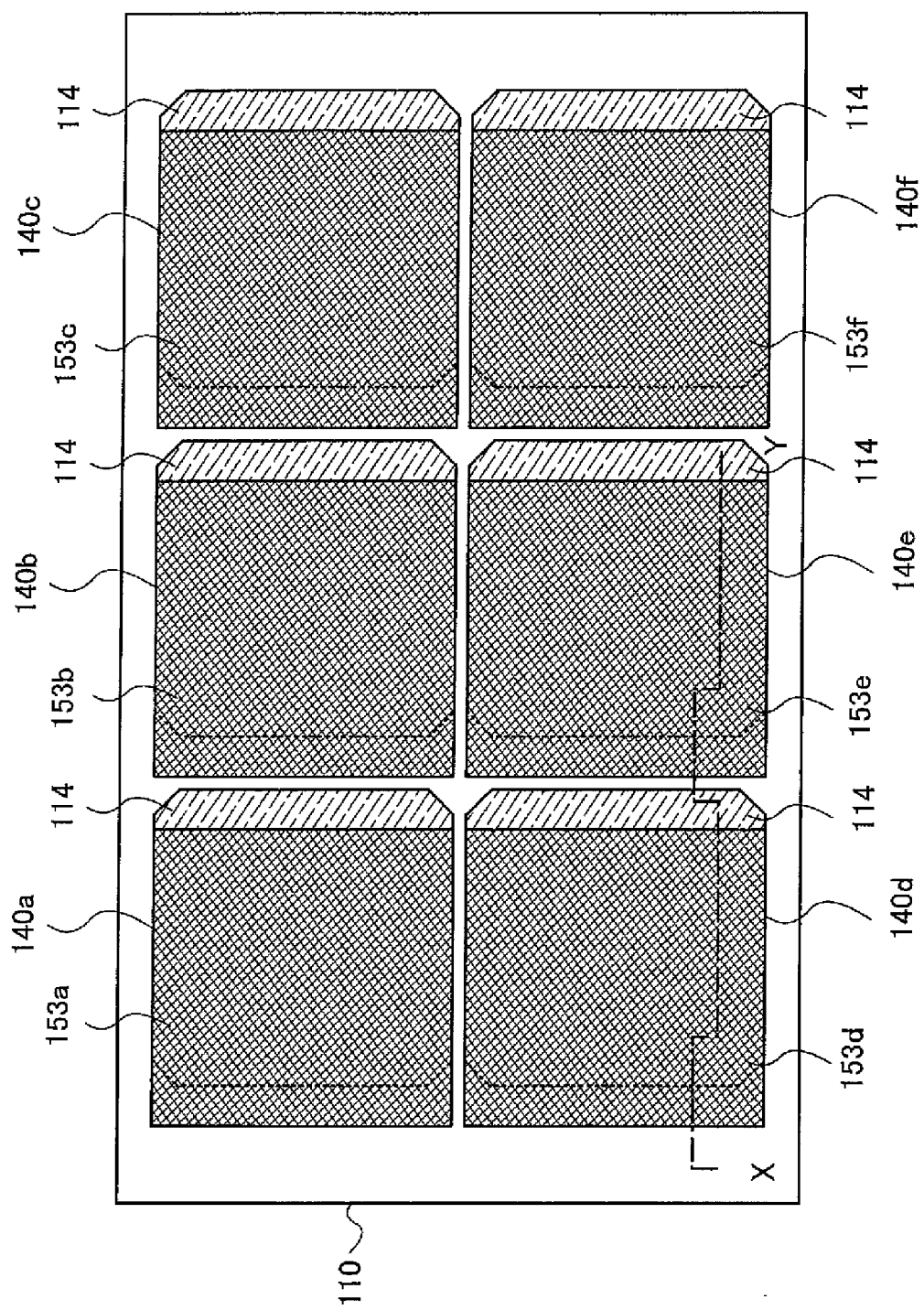
FIG. 10 is a plan view illustrating a manufacturing method of a photoelectric conversion device module according to one embodiment of the present invention.

As illustrated in FIG. 10, a photoelectric conversion cell 140a, a photoelectric conversion cell 140b, a photoelectric conversion cell 140c, a photoelectric conversion cell 140d, a photoelectric conversion cell 140e, and a photoelectric conversion cell 140f that are arranged with a predetermined interval therebetween are formed. Specifically, the second electrode 142, the second unit cell 130 and the first unit cell 120 in regions not provided with resist masks 153a to 153f are selectively etched to form the photoelectric conversion cells 140a to 140f. The element-separated photoelectric conversion cells 140a to 140f each have a structure in which the first electrode 114, the first unit cell 120, the second unit cell 130 and the second electrode 142 are stacked. The first unit cell 120 has a stacked structure of the first impurity semiconductor layer 122n+, the single-crystal semiconductor layer 124i and the second impurity semiconductor layer 126p, and the second unit cell 130 has a stacked structure in which the third impurity semiconductor layer 132n, the non-single-crystal semiconductor layer 134i and the fourth impurity semiconductor layer 136p. In this embodiment, the stacked structure of the first unit cell 120 and the second unit cell 130 forms an nipnip junction. Further, an end portion of the first electrode 114 included in one of the adjacent photoelectric conversion cells that are electrically connected in series later is exposed, and an end portion of the first electrode 114 included in the other of the adjacent photoelectric conversion cells is covered with the semiconductor layer (here the single-crystal semiconductor layer 124i). For example, between the photoelectric conversion cell 140a and the photoelectric conversion cell 140b, the first electrode 114 of the photoelectric conversion cell 140a is exposed and the first electrode 114 of the photoelectric conversion cell 140b is covered with the single-crystal semiconductor layer 124i.

The above-described etching step may be conducted under such conditions that the selectivity in etching between the first electrode 114 and the layer stacked over the first electrode 114 (including the first impurity semiconductor layer 122n+, the single-crystal semiconductor layer 124i, the second impurity semiconductor layer 126p, the third impurity semiconductor layer 132n, the non-single-crystal semiconductor layer 134i, the fourth impurity semiconductor layer 136p and the second electrode 142) is sufficiently high. In addition, the etching may be wet etching or dry etching as appropriate. For example, the second electrode 142 that is formed with a transparent conductive material such as ITO is etched by wet etching. In addition, the semiconductor layer included in the first unit cell 120 and the second unit cell 130 can be etched by dry etching using a fluorine-based gas. After element-separated photoelectric conversion cells 140a to 140f are formed, the resist masks 153a to 153f that have become unnecessary are removed.

The second electrode 142 can be selectively formed using a shadow mask. Alternatively, the second electrode 142 can be selectively formed using a conductive high molecular material by a droplet discharge method, a printing method or the like. The selectively-formed second electrode 142 can be used instead of the resist masks 153a to 153f. In that case, it is unnecessary to additionally form a mask for etching, and the process can be simplified.

The auxiliary electrode 144 is formed over the second electrode 142. In addition, the connecting electrode 146 is formed with the same layer as the auxiliary electrode 144, and adjacent photoelectric conversion cells are connected in series or in parallel (FIG. 7B).

The auxiliary electrode 144 is selectively provided because light enters through the second electrode 142. There is no particular limitation on the shape of the auxiliary electrode 144, and the shape may be determined as appropriate by a person who carries out this invention, but the shape may be determined considering that the second electrode 142 side is a light-incident plane. For example, as illustrated in FIG. 1, the auxiliary electrode 144 is provided to have a shape such as a comb-like shape, a pectinated shape or a grid shape. The auxiliary electrode 144 is formed by a printing method or the like using nickel, aluminum, silver, lead-tin (solder), or the like. For example, the auxiliary electrode 144 is formed using a nickel paste or silver paste by a screen printing method.

Further, the connecting electrode 146 is formed together with the auxiliary electrode 144. The connecting electrode 146 extends from one photoelectric conversion cell to another photoelectric conversion cell, which are adjacent to each other, and connects the photoelectric conversion devices in series or in parallel.

Figure 7B:
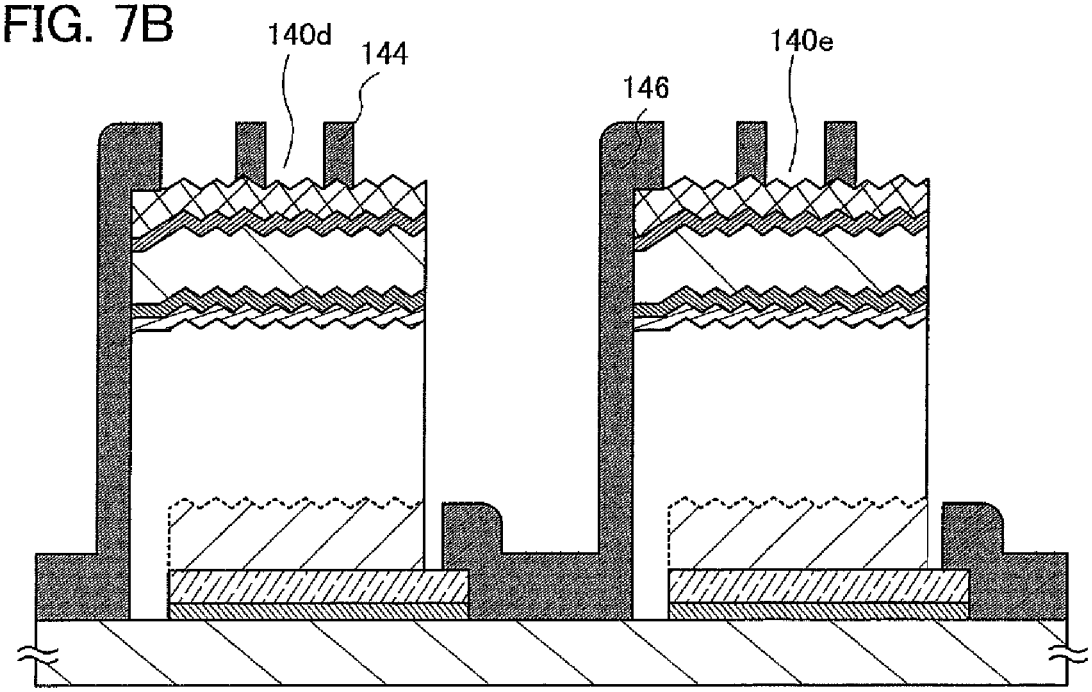

In FIG. 7B, between the photoelectric conversion cell 140d and the photoelectric conversion cell 140e which are adjacent, the connecting electrode 146 exists extending from the first electrode 114 of the photoelectric conversion cell 140d to the second electrode 142 of the photoelectric conversion cell 140e, and thereby the photoelectric conversion cell 140d and the photoelectric conversion cell 140e are connected in series. In the example of FIG. 1, the photoelectric conversion cell 140a, the photoelectric conversion cell 140b and the photoelectric conversion cell 140c are connected in series, while the photoelectric conversion cell 140d, the photoelectric conversion cell 140e and the photoelectric conversion cell 140f are connected in series. In the example, the serially-connected photoelectric conversion cell 140a to 140c and the serially-connected photoelectric conversion cell 140d to 140f are connected in parallel. Here, parallel-connection is formed by a connecting electrode extending from the second electrode 142 of the photoelectric conversion cell 140a to the second electrode 142 of the photoelectric conversion cell 140d, and parallel connection is formed by the connecting electrode extending from the second electrode 142 of the photoelectric conversion cell 140c to the second electrode 142 of the photoelectric conversion cell 140f.

The connecting electrode 146 is formed with the same layer the auxiliary electrode 144 by a screen printing method. Needless to say, the connecting electrode 146 can be formed with a different layer from the auxiliary electrode 144. Further, an auxiliary electrode may be provided to be in contact with the first electrode 114, and the auxiliary electrode in contact with the first electrode 114 may be connected to the connecting electrode.

In the case of forming the electrodes by a screen printing method using a conductive paste, the thickness of each electrode can be about several micrometers to several hundreds of micrometers. However, the illustrated schematic diagram does not necessarily illustrate the device in the actual dimension.

Through the above-described steps, the photoelectric conversion device module illustrated in FIG. 1 can be formed.

In this embodiment, a multiple junction type photoelectric conversion device module in which photoelectric conversion devices each having a stacked structure of a cell including a single-crystal semiconductor layer sliced from a single-crystal semiconductor substrate and a cell including a non-single-crystal semiconductor layer over the single-crystal semiconductor layer are integrated can be manufactured. As described above, the single-crystal semiconductor substrate separated from the single-crystal semiconductor layer by slicing can be reused, and thus a resource-saving type photoelectric conversion device and photoelectric conversion device module that utilize a semiconductor material can be manufactured. In addition, because the cell includes a single-crystal semiconductor layer, the photoelectric conversion efficiency can be improved. Such photoelectric conversion devices having high efficiency and resource saving are integrated, a photoelectric conversion device module that gives desired power owing to the excellent photoelectric conversion characteristics can be provided.

In addition, a passivation layer functioning as an anti-reflection layer may be formed over the second electrode 142. For example, a silicon nitride layer, a silicon nitride oxide layer or magnesium fluoride layer may be formed. Provision of the passivation layer functioning an anti-reflection layer can reduce reflection on the light-incident plane.

Further, in the example of this embodiment, the first impurity semiconductor layer 122n+ and the third impurity semiconductor layer 132n are n-type semiconductors, and the second impurity semiconductor layer 126p and the fourth impurity semiconductor layer 136p are p-type semiconductors; however, the n-type semiconductors and the p-type semiconductors can be replaced with each other.

Figure 12:
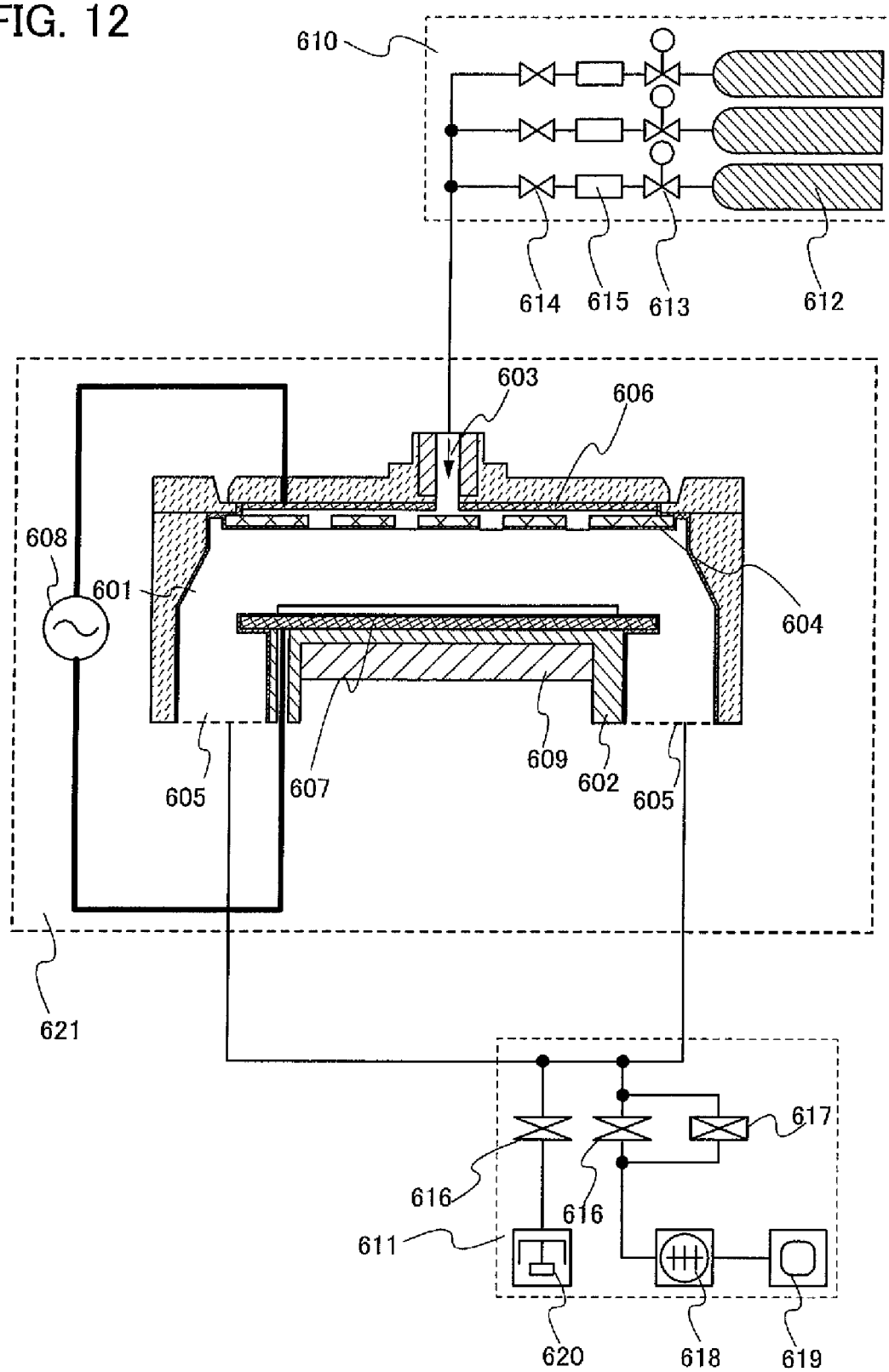
FIG. 12 is a diagram of a plasma CVD apparatus capable of being used for manufacturing a photoelectric conversion device module according to one embodiment of the present invention.

Next, an example of a plasma CVD apparatus that can be used for formation of the non-single-crystal semiconductor layer according to this embodiment is illustrated in FIG. 12.

A plasma CVD apparatus 621 illustrated in FIG. 12 is connected to a gas supply means 610 and an exhaust means 611.

The plasma CVD apparatus 621 illustrated in FIG. 12 includes a reaction chamber 601, a stage 602, a gas supply portion 603, a shower plate 604, an exhaust port 605, an upper electrode 606, a lower electrode 607, an AC power source 608, and a temperature control portion 609.

The reaction chamber 601 is formed from a material having rigidity and can be evacuated to vacuum. The reaction chamber 601 is provided with the upper electrode 606 and the lower electrode 607. Although FIG. 12 illustrates a capacitively coupled (parallel flat plate) type structure, another structure such as an inductively coupled type may be employed as long as plasma can be generated in the reaction chamber 601.

When treatment is performed with the plasma CVD apparatus illustrated in FIG. 12, a predetermined gas is supplied through the gas supply portion 603. The supplied gas is introduced to the reaction chamber 601 through the shower plate 604. High-frequency power is applied with the AC power source 608 connected to the upper electrode 606 and the lower electrode 607 to excite the gas in the reaction chamber 601, whereby plasma is generated. Further, the gas in the reaction chamber 601 is exhausted through the exhaust port 605 connected to a vacuum pump. Moreover, with the use of the temperature control portion 609, plasma process can be performed while the object to be treated is heated.

The gas supply means 610 includes a cylinder 612 which is filled with a reaction gas, a pressure adjusting valve 613, a stop valve 614, amass flow controller 615, and the like. In the reaction chamber 601, the shower plate 604 which has a plate-like shape and is provided with a plurality of small openings is provided between the upper electrode 606 and the lower electrode 607. A reaction gas that is supplied to the upper electrode 606 passes through a hollow portion in the upper electrode 606, and is supplied into the reaction chamber 601 through the openings.

The exhaust means 611 that is connected to the reaction chamber 601 has a function of vacuum evacuation and a function of controlling the pressure inside the reaction chamber 601 to be maintained at a predetermined level when a reaction gas is introduced. The exhaust means 611 includes a butterfly valve 616, a conductance valve 617, a turbomolecular pump 618, a dry pump 619, and/or the like. When the butterfly valve 616 and the conductance valve 617 are provided in parallel, the exhaust velocity of a reaction gas can be controlled to keep the pressure in the reaction chamber 601 in a predetermined range by closing the butterfly valve 616 to operate the conductance valve 617. Moreover, to open the butterfly valve 616 having higher conductance makes it possible to perform high-vacuum evacuation.

In the case of evacuating the reaction chamber 601 to ultrahigh vacuum of a pressure lower than $10^{-5}$ Pa, a cryopump 620 is preferably used in combination. Alternatively, in the case where the reaction chamber 601 is evacuated to ultrahigh vacuum as ultimate vacuum, the inner wall of the reaction chamber 601 may be processed into a mirror surface and the reaction chamber 601 may be provided with a heater for baking in order to reduce degassing from the inner wall.

Note that by precoating treatment performed so that a film is formed covering the entire inner wall of the reaction chamber 601 as illustrated in FIG. 12, it is possible to prevent an impurity element attached to or included in the inner wall of the reaction chamber from mixing into a film which is to be formed or the like.

Figure 13:
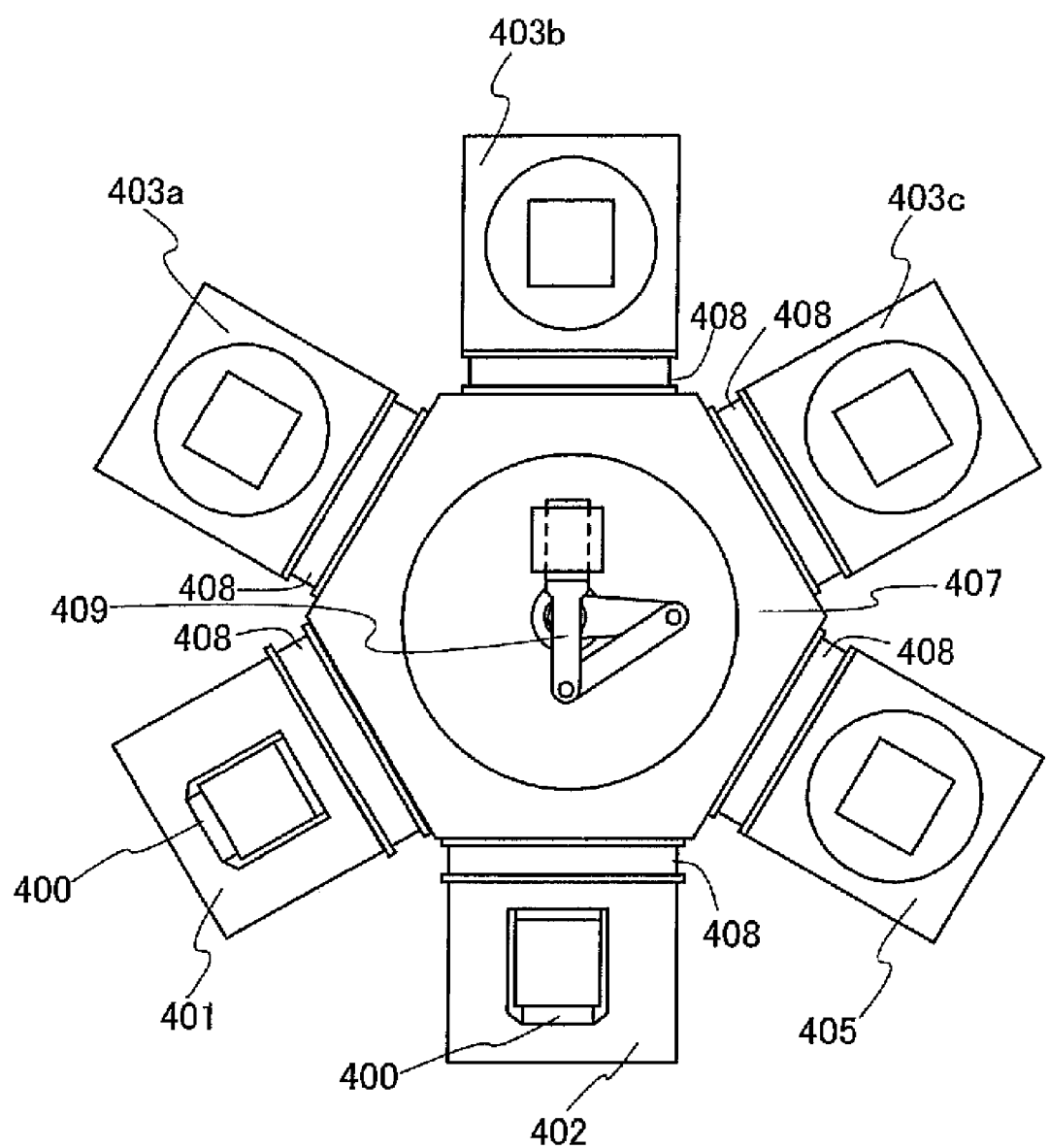
FIG. 13 is a diagram illustrating a structure of a multi-chamber plasma CVD apparatus provided with a plurality of reaction chambers.

The plasma CVD apparatus illustrated in FIG. 12 can have a multi-chamber structure as illustrated in FIG. 13. This apparatus illustrated in FIG. 13 includes a load chamber 401, an unload chamber 402, a reaction chamber (1) 403a, a reaction chamber (2) 403b, a reaction chamber (3) 403c, and a spare chamber 405 around a common chamber 407. For example, an n-type semiconductor layer is formed in the reaction chamber (1) 403a, an i-type semiconductor layer is formed in the reaction chamber (2) 403b, and a p-type semiconductor layer is formed in the reaction chamber (3) 403c. An object to be treated is transferred in and out of each reaction chamber through the common chamber 407. A gate valve 408 is provided between the common chamber 407 and each chamber such that treatments performed in different reaction chambers do not interfere with each other. The substrate is disposed at a cassette 400 in the load chamber 401 and in the unload chamber 402 and transferred to the reaction chamber (1) 403a, the reaction chamber (2) 403b, and the reaction chamber (3) 403c by a transfer means 409 of the common chamber 407. In this apparatus, a reaction chamber can be provided for each kind of films to be deposited, and a plurality of different kinds of films can be formed in succession without being exposed to the air.

The second impurity semiconductor layer 126p to the fourth impurity semiconductor layer 136p can be formed with use of plasma generated by introducing a reaction gas in a reaction chamber (reaction space) of a plasma CVD apparatus with the structure as illustrated in FIG. 12 and FIG. 13. Further, the non-single-crystal semiconductor layer for formation of the single crystal semiconductor layer 124i can be formed or the single-crystal semiconductor layer 124i can be formed by vapor-growth of the first semiconductor impurity layer 122n+. In other words, after the first impurity semiconductor layer 122n+ which is a single-crystal semiconductor layer sliced from the single-crystal semiconductor substrate, the single-crystal semiconductor layers 124i to 136p can be formed successively without being exposed to air with a plasma CVD apparatus having a multichamber structure as illustrated in FIG. 13. The successive formation of the semiconductor layers without being exposed to air in this manner can keep the interface characteristics forming a semiconductor junction favorable, which can lead to improvement of the photoelectric conversion characteristics.

In addition, in the case of the pin junction as in this embodiment, reactive chambers corresponding to the p layer, the i layer and the n layer respectively are preferably provided. FIG. 13 illustrates an example in which three reaction chambers are provided according to the number of stacked layers (the p-type impurity semiconductor layer, the i-type semiconductor layer and the n-type impurity semiconductor layer).

For example, in the case of forming an ni junction, a pi junction, or a pn junction as a photoelectric conversion layer, the number of reaction chambers used for forming semiconductor layers may be two. In the case of stacking layers having the same conductivity type but different concentrations, such as a pp-n junction or a p+pp-n junction, the number of reaction chambers may be four; however, as long as the concentration of the gas containing an impurity element to be introduced into the reaction chamber is controlled, the number of reaction chambers may be two in some cases.

An example of forming the single-crystal semiconductor layer 124i to the fourth impurity semiconductor layer 136p is described. First, plasma is generated by introducing a first reaction gas to a reaction chamber (2) 403b where the base substrate 110 on which the steps up to the step of forming the single-crystal semiconductor layer 122n+ as an object to be treated are completed is delivered, so that the single-crystal semiconductor layer 124i (i-type semiconductor layer) is formed by epitaxial growth of the first impurity semiconductor layer 122n+. Next, the base substrate 110 is transferred from the reaction chamber (2) 403b to a reaction chamber (3) 403c without being exposed to the air. A second reaction gas is introduced to the reaction chamber (3) 403c to generate plasma, so that the second impurity semiconductor layer 126p (p-type semiconductor layer) is formed over the single-crystal semiconductor layer 124i. Next, the base substrate 110 is transferred from the reaction chamber (3) 403c to a reaction chamber (1) 403a without being exposed to the air. A third reaction gas is introduced to the reaction chamber (1) 403a to generate plasma, so that the third impurity semiconductor layer 132n (n-type semiconductor layer) is formed over the second impurity semiconductor layer 126p. Then, the base substrate 110 is transferred from the reaction chamber (1) 403a to the reaction chamber (2) 403b without being exposed to the air. A fourth reaction gas is introduced to the reaction chamber (2) 403b to generate plasma, so that the non-single-crystal semiconductor layer 134i (i-type semiconductor layer) is formed over the third impurity semiconductor layer 132n. Then, the base substrate 110 is transferred from the reaction chamber (2) 403b to the reaction chamber (3) 403c without being exposed to the air. A fifth reaction gas is introduced to the reaction chamber (3) 403c to generate plasma, so that the fourth impurity semiconductor layer 136p (p-type semiconductor layer) is formed over the non-single-crystal semiconductor layer 134i.

Note that this embodiment can be combined with any of the other embodiments as appropriate.

Embodiment 2

In this embodiment, an example of a method of manufacturing a photoelectric conversion device and a photoelectric conversion device module, which are different from that in the above embodiment, will be described. Note that description for the same parts as those of the above embodiment is omitted or partly simplified.

In the example of Embodiment 1, the n-type single-crystal semiconductor layer sliced from the n+ type semiconductor substrate is formed and the n+ type single-crystal semiconductor layer itself serves as the first impurity semiconductor layer 122n+. This embodiment describes an example, in which an n-type single-crystal semiconductor substrate is applied instead of the n+ type single-crystal semiconductor substrate.

Figure 14A:
FIGS. 14A to 14D are cross-sectional views illustrating a formation method of another embodiment of a photoelectric conversion device module.

As the single-crystal semiconductor substrate 101, an n-type single-crystal semiconductor substrate is prepared (FIG. 14A).

Figure 14B:
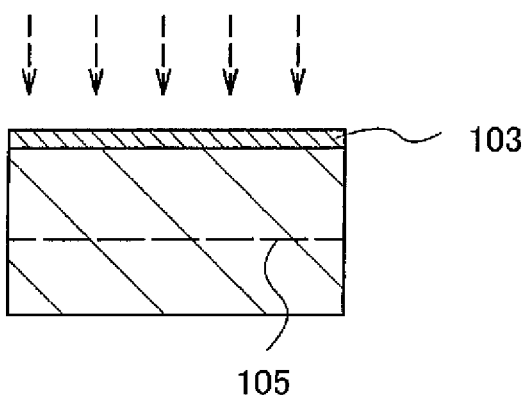
Figure 14C:
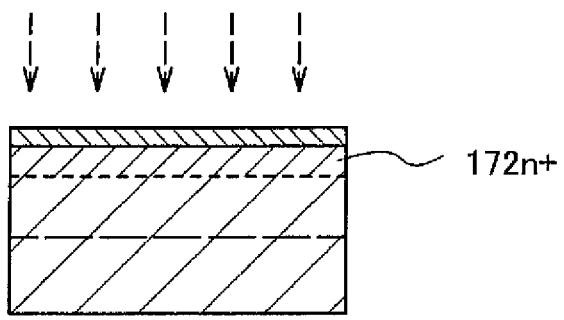

The embrittlement layer 105 is formed in a region at a predetermined depth from one surface of the single-crystal semiconductor substrate 101 (FIG. 14B), and an impurity element of a first conductivity type is introduced though one surface of the single-crystal semiconductor substrate 101 to form a first impurity region 172n+ (FIG. 14C).

The embrittlement layer 105 is formed in the same manner as the description of FIG. 3B of Embodiment 1 described above. Specifically, the embrittlement layer 105 can be formed by an ion-implantation method or an ion-doping method by which irradiation with ions accelerated by voltage is performed, a method utilizing a laser beam that allows multiphoton absorption, or the like.

The impurity element of the first conductivity type is introduced from the side of the insulating layer 103 that is formed to prevent damages to the single-crystal semiconductor substrate 101. Examples of an introduction method of the impurity element imparting the first conductivity type, include an ion doping method, an ion implantation method, and a laser doping method. Alternatively, in a case where the first impurity region 172n+ is formed before the formation of the embrittlement layer 105, the first impurity region 172n+ can be formed by thermal diffusion.

In this embodiment, an n-type impurity element (e.g., phosphorus) as the first conductivity type is introduced into the single-crystal semiconductor substrate 101, and an n-type first impurity region 172n+ is formed on the side of the surface of the single-crystal semiconductor substrate 101 on which the insulating layer 103 is formed. For example, an ion doping apparatus by which generated ions are accelerated by voltage without mass separation and the substrate is irradiated with an ion stream is used, and phosphorus is introduced using phosphine as a source gas. At that time, hydrogen or helium may be added to phosphine as a source gas. By the use of an ion doping apparatus, the area to be irradiated with the ion beam can be enlarged. Even the single-crystal semiconductor substrate 101 has an area with a diagonal length of longer than 300 mm, it can be processed efficiently. For example, a linear ion beam whose long side has a length of more than 300 mm is formed and delivered from one end to the other end of the single-crystal semiconductor substrate 101; thus, the first impurity semiconductor region 172n+ can be formed at a uniform depth.

As in this embodiment, in the case of using an n-type single-crystal semiconductor substrate as the single semiconductor substrate 101, an n-type impurity element is introduced so that the first impurity region 172n+ that is a high concentration n region (n+ region) can be formed.

Figure 14D:
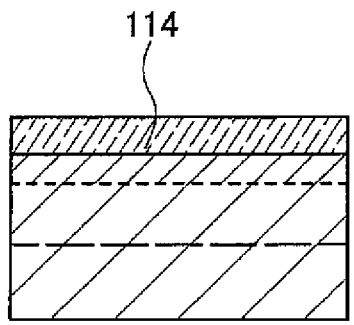

After removing the insulating layer 103 which has become unnecessary, the first electrode 114 is formed over the single-crystal semiconductor substrate 101 on the first impurity region 172n+ side (FIG. 14D).

After that, a photoelectric conversion device and a photoelectric conversion device module can be manufactured through a manufacturing process illustrated in FIG. 3D to FIG. 7B.

In the structure of the first unit cell of the photoelectric conversion device and the photoelectric conversion device module that is completed in this embodiment, a n+nip junction is formed in the direction of stacking layers of cells, starting from the first electrode 114 side. The carrier collection efficiency can be improved by providing a difference in concentration like a difference between n+ and n, and arranging a higher concentration region on the electrode side. Needless to say, the first unit cell according to this embodiment may form a p+pin junction by replacement of the n type and the p type, where a back surface field (BSF) is formed.

Further, in the example of this embodiment, after forming the embrittlement layer 105 in the single-crystal semiconductor substrate 101, the first impurity region 172n+ is formed and the first electrode 114 is formed on the surface on which the first impurity region 172n+ is formed, but the order of formation of the embrittlement layer 105 to the first electrode 114 is not limited thereto. For example, after the first impurity region 172n+ is formed on one surface of the single-crystal semiconductor substrate 101, the embrittlement layer 105 is formed in a region at a predetermined depth of the single-crystal semiconductor substrate 101 and the first electrode 114 is formed on the surface of the single-crystal semiconductor substrate 101 on which the first impurity region 172n+ is formed. In addition, after the first electrode is formed, the embrittlement layer 105 and the first impurity region 172n+ may be formed with the first electrode functioning as a protective layer.

Note that this embodiment can be combined with any of the other embodiments as appropriate.

Embodiment 3

In this embodiment, an example of a method of manufacturing a photoelectric conversion device and a photoelectric conversion device module, which are different from that in the above embodiment, will be described. Specifically, a method for forming a modified region to serve as an embrittlement layer in a single-crystal semiconductor substrate with use of multiphoton absorption is described. Note that description for the same parts as those of the above embodiment is omitted or partly simplified.

Figure 15:
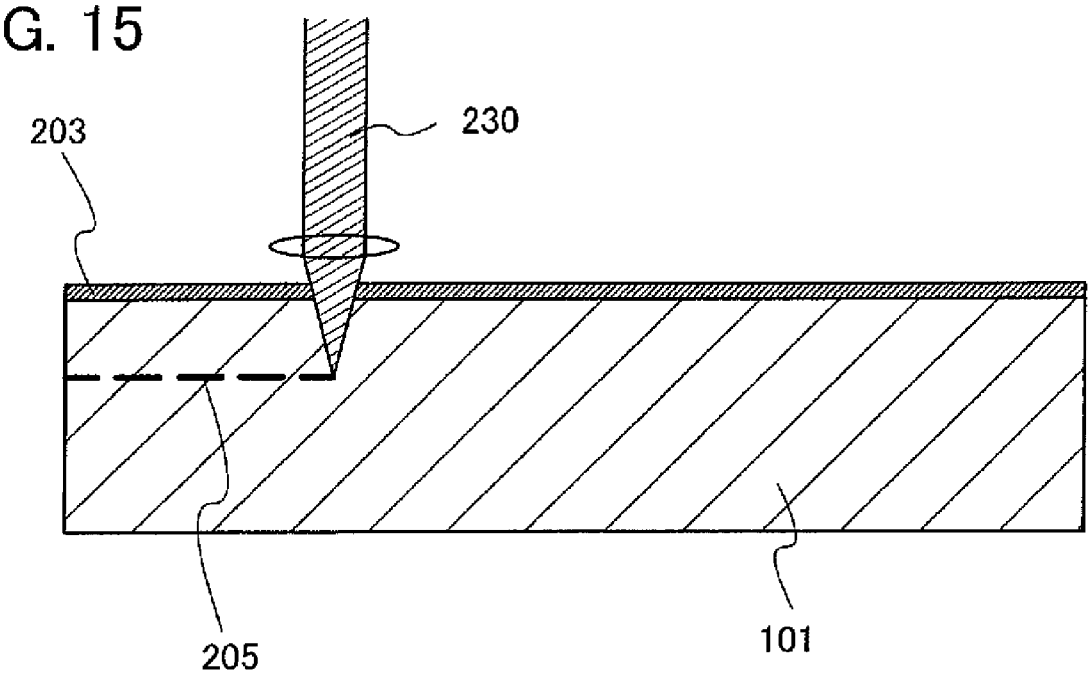
FIG. 15 is a cross-sectional view illustrating a formation method of another embodiment of an embrittlement layer.

As illustrated in FIG. 15, a laser beam 230 is condensed inside the single-crystal semiconductor substrate 101 from the side of the surface on which the insulating layer 203 is formed. By scanning the single-crystal semiconductor substrate 101 with the laser beam 230, a modified region 205 is formed in a region at a predetermined depth of the single-crystal semiconductor substrate 101. A laser beam that allows multiphoton absorption is applied as the laser beam 230 and the focal point of the laser beam 230 is set at a predetermined depth so that the single-crystal semiconductor substrate 101 is entirely scanned to form the modified region 205. The modified region 205 has the same state as the embrittlement layer 105.

The multiphoton absorption is a phenomenon that a substance absorbs multiple photos at the same time and energy of the substance has a higher energy level than energy before light absorption. As the laser beam 230 that allows multiphoton absorption, a laser beam emitted from a femtosecond laser is applied. One of the nonlinear interactions which are made by a femtosecond laser, multiphoton absorption is given. Multiphoton absorption can generate more reaction near the focal point than one photon absorption, and thus damages to other regions are reduced and the modified region can be formed at a desired region. For example, irradiation with the laser beam 230 that allows multiphoton absorption can form the modified region 205 having voids with several nanometers.

In the formation of the modified region 205 utilizing multiphoton absorption, the depth of the modified region 205 is determined depending on the position of the focal point of the laser beam 230 (the depth of the focal point of the laser beam 230 of the single-crystal semiconductor substrate 101). The position of the focal point of the laser beam 230 can be set freely by a person who carries out this invention.

As in this embodiment, the modified region 205 is formed using multiphoton absorption, and damages to regions other than the modified region 205 and generation of crystal defects can be prevented. Thus, a single-crystal semiconductor layer having favorable characteristics such as crystallinity can be formed by being sliced with the modified region 205 as a boundary.

Note that it is preferable that the insulating layer 203 of an oxide layer such as a silicon oxide layer or a silicon oxynitride layer is formed over the single-crystal semiconductor substrate 101, and irradiation with the laser beam 230 is conducted through the insulating layer 203. Further, the following formula (1) is preferably satisfied where the wavelength of the laser beam 230 is λ (nm), the refractive index of the insulating layer 203 (oxide layer) at the wavelength λ (nm) is $n_{oxide}$, and the thickness of the insulating layer 203 (oxide layer) is d (nm).

[Formula 1]

$$d=\lambda/4n_{oxide}\times(2m+1) \text{ (m indicates integer number that is 0 or more)} \quad (1)$$

By forming the insulating layer 203 so as to satisfy the formula (1), reflection of the laser beam 230 on the surface of the object (single-crystal semiconductor substrate 101) can be suppressed. As a result, the modified region 205 can be efficiently formed inside the single-crystal semiconductor substrate 101.

After the formation of the modified region 205, the photoelectric conversion device and the photoelectric conversion device module can be manufactured through the manufacturing process illustrated in FIG. 3C to FIG. 7B.

The slicing of the single-crystal semiconductor substrate 101 can be conducted by application of external force instead of heat treatment. Specifically, external force is applied using a dynamical or mechanical method having a process based on the rule of dynamics, whereby the thin single-crystal semiconductor substrate 101 can be separated with the modified region 205. For example, the thin single-crystal semiconductor substrate 101 can be separated with a hand of a human or a tool. The modified region 205 is weakened due to voids or the like formed by irradiation with the laser beam 230. Therefore, by application of physical force (external force) to the single-crystal semiconductor substrate 101, a weakened portion such as the voids in the modified region 205 as a trigger or a starting point causes or allows the single-crystal semiconductor substrate 101 to be separated. The separation of the single-crystal semiconductor substrate 101 can be separated also by combination of heat treatment and application of external force. The separation of the single-crystal semiconductor substrate 101 by application of external force makes it possible to reduce time needed for the slicing, which can lead to improvement of productivity.

Note that this embodiment can be combined with any of the other embodiments as appropriate.

Embodiment 4

In this embodiment, an example of a method of manufacturing a photoelectric conversion device and a photoelectric conversion device module, which are different from that in the above embodiment, will be described. Note that description for the same parts as those of the above embodiment is omitted or partly simplified.

As illustrated in FIG. 3C, the single-crystal semiconductor substrate 101 in which the embrittlement layer 105 is formed in a region at a predetermined depth and which is provided with the first electrode 114 on its one surface is obtained. Aluminum is preferably used for the first electrode 114.

Figure 16:
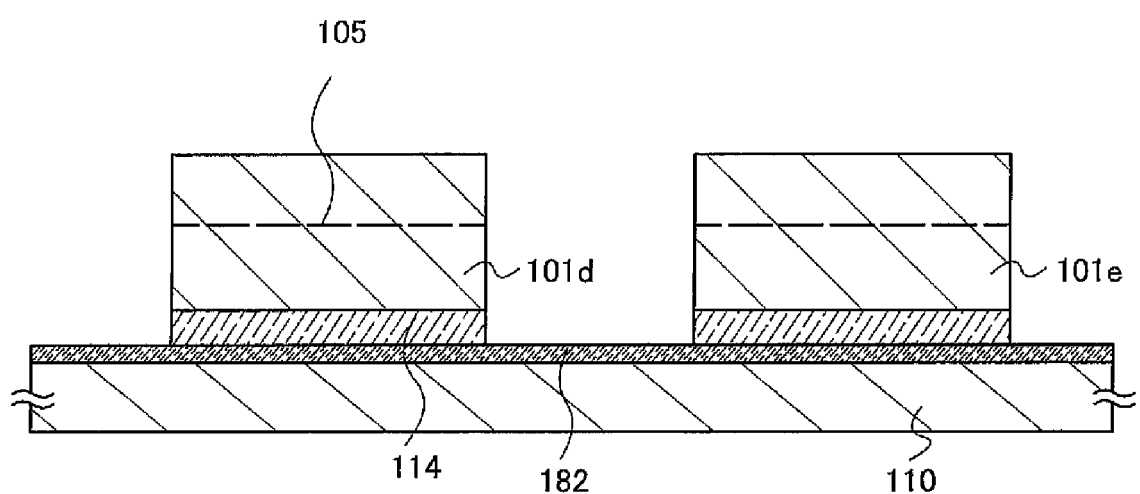
FIG. 16 is a cross-sectional view illustrating a manufacturing method of another embodiment of a photoelectric conversion device module.

By an ultrasonic bonding method, the insulating layer 182 formed over the base substrate 110 and the first electrode 114 formed over the single-crystal semiconductor substrate 101 are directly bonded (FIG. 16).

The insulating layer 182 formed on one surface of the base substrate 110 has a single layer structure or a stacked layer structure. The insulating layer 182 preferably has at least one layer of a nitride layer including nitrogen as a component, such as a silicon nitride layer, a silicon nitride oxide layer or a silicon oxynitride layer. By forming the insulating layer 182 including a nitride film over the base substrate 110 side, an impurity element such as an alkali metal element or an alkaline earth metal element from the base substrate 110 can be prevented from diffusing to the single-crystal semiconductor substrate 101 side.

Specifically, ultrasonic waves are applied to the superposed state of the first electrode 114 that is a bonding plane on the single-crystal semiconductor substrate 101 side and the insulating layer 182 that is a bonding plane over the base substrate 110 side, so that the both are melted and bonded by frictional heat generated in the bonding planes to form bonding. Preferably, the superposed state of the single crystal semiconductor substrate 101 and the base substrate 110 are subjected to ultrasonic waves while being pressurized, so that bonding strength can be increased. In addition, when the first electrode 114 is formed using aluminum, an ultrasonic wave bonding can be easily formed.

After that, the photoelectric conversion device and the photoelectric conversion device module can be manufactured through the manufacturing process illustrated in FIG. 4B to FIG. 7B.

As described above, in the photoelectric conversion device and the photoelectric conversion device module according to one embodiment of the present invention, there are no particular limitations on the bonding method as long as the base substrate and the single-crystal semiconductor substrate can be bonded to each other with the first electrode therebetween. By attachment with use of ultrasonic wave bonding, a strong bonding can be formed between the base substrate and the single-crystal semiconductor substrate.

Note that this embodiment can be combined with any of the other embodiments as appropriate.

Embodiment 5

In this embodiment, am example of a method of manufacturing a photoelectric conversion device and a photoelectric conversion device module, which are different from that in the above embodiment, will be described. Note that description for the same parts as those of the above embodiment is omitted or partly simplified.

As illustrated in FIG. 3D, the single-crystal semiconductor substrate 101 in which the embrittlement layer 105 is formed in a region at a predetermined depth, and the first electrode 114 and the insulating layer 112 are formed in this order over its one surface is formed.

Next, a planarization process is conducted to the surface of the insulating layer 112 formed over the single-crystal semiconductor substrate 101 by plasma treatment.

Specifically, planarization treatment is performed in a plasma state by introducing an inert gas (e.g., an Ar gas) and/or a reaction gas (e.g., an $O_2$ gas or an $N_2$ gas) into a vacuum chamber and applying bias voltage to an object to be treated (here, the single-crystal semiconductor substrate 101 provided with the insulating layer 112). In plasma, an electron and a cation of Ar are present, and the cation of Ar is accelerated in a cathode direction (toward the single-crystal semiconductor substrate 101 provided with the insulating layer 112). The accelerated cation of Ar collides with the surface of the insulating layer 112 so that the surface of the insulating layer 112 is sputter-etched. At that time, a convex portion on the surface of the insulating layer 112 is dominantly sputter-etched so that planarity of the surface of the insulating layer 112 can be improved. In the case where a reaction gas is introduced, a defect generated due to the sputter etching performed on the surface of the insulating layer 112 can be repaired.

By the planarization treatment with use of plasma treatment, the average surface roughness (Ra) of the surface of the insulating layer 112 can be good, for example, it can be 5 nm or less, preferably 0.3 nm or less. In addition, the maximum peak-to-valley height (P-V) is 6 nm or less, preferably 3 nm or less. In other words, the planarity of the surface of the insulating layer 112 serving as a bonding plane can be improved by the planarization treatment.

As an example of the plasma treatment, an electric power used for treatment is from 100 W to 1000 W, a pressure is from 0.1 Pa to 2.0 Pa, a gas flow rate is from 5 sccm to 150 sccm, and a bias voltage is from 200 V to 600 V.

After the planarization treatment, as illustrated in FIG. 4A, the surface of the insulating layer 112 formed over the single-crystal semiconductor substrate 101 and the surface of the base substrate 110 are bonded so that the single-crystal semiconductor substrate 101 is attached over the base substrate 110. In this embodiment, the planarity of the surface of the insulating layer 112 is improved so that a strong bonding can be formed.

The planarization treatment described in this embodiment may be conducted to the base substrate 110 side. Specifically, plasma treatment is conducted with application of a bias voltage to the base substrate 110 to improve the planarity.

Note that this embodiment can be combined with any of the other embodiments, as appropriate.

Embodiment 6

In this embodiment an example of a method of manufacturing a photoelectric conversion device and a photoelectric conversion device module, which are different from that in the above embodiment, will be described. Note that description for the same parts as those of the above embodiment is omitted or partly simplified.

Crystallinity recovery or damage repairing of the single-crystal semiconductor layers can be made by heat treatment or laser processing, after the single-crystal semiconductor layers which have been formed by being sliced from the single-crystal semiconductor substrates are arranged over the base substrate with a predetermined interval therebetween. In an example of this embodiment, crystallinity recovery or damage repairing is made by laser processing. In addition, as illustrated in FIG. 4B, example in which an n+ type single-crystal semiconductor substrates 101 are sliced and single-crystal semiconductor layers (here the first impurity semiconductor layer 122n+) are arranged over the base substrate 110 with a predetermined interval therebetween is described.

Figure 17:
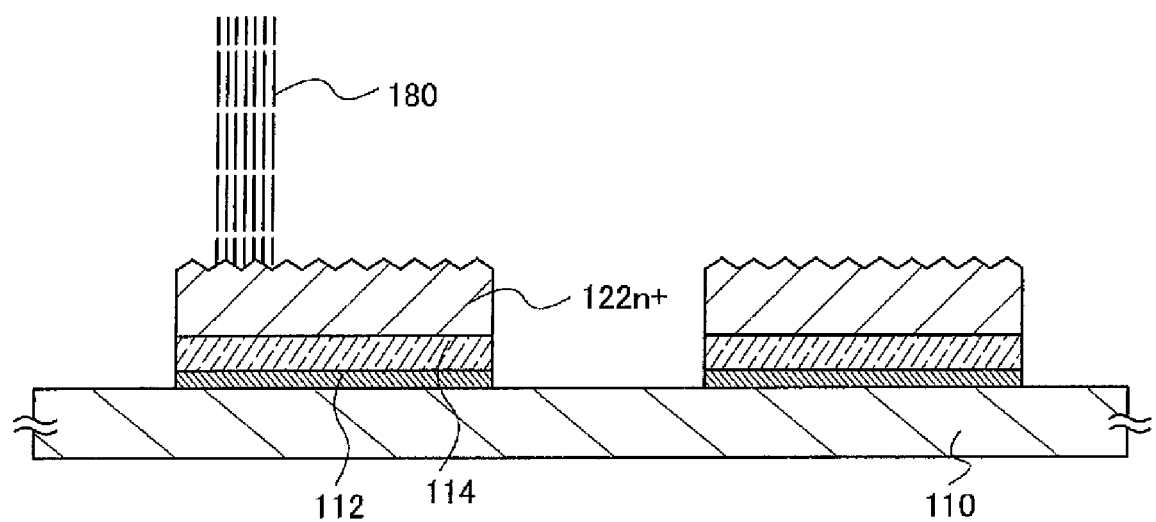
FIG. 17 is a cross-sectional view illustrating a manufacturing method of another embodiment of a photoelectric conversion device module.

For example, as illustrated in FIG. 17, the single-crystal semiconductor layers (here the first impurity semiconductor layers 122 n+) formed over the base substrate 110 are irradiated with a laser beam 180 from the top surface side of the single-crystal semiconductor layers and the single-crystal semiconductor layers are melted. Then, the single-crystal semiconductor layers are cooled to be solidified and thus crystallinity of the single-crystal semiconductor layers is improved.

The melting state of the single-crystal semiconductor layers by irradiation with the laser beam 180 may be either partially-melted state or completely-melted state. Preferably, the upper layer (the superficial layer side) is melted to be in a liquid phase and the lower layer (which is in contact with or closer to the first electrode) is not melted to be in a solid phase so that a partially-melted state is obtained, whereby crystals are grown from the solid phase portion. Note that in this specification, the term "completely-melted" means that the single-crystal semiconductor layer is melted to the vicinity of the lower interface (the interface with the first electrode) to be made in a liquid phase; the term "partially-melted" means that a part (e.g., an upper part) of the single-crystal semiconductor layer is melted to be made in a liquid phase whereas another part (e.g., a lower part) is kept in a solid phase without being melted.

As the laser beam 180 applicable to the laser treatment according to this embodiment, a laser beam having a wavelength that is absorbed by the single-crystal semiconductor layer is employed. The wavelength of a laser beam can be determined in consideration of the skin depth of the laser beam, or the like. For example, light having an emission wavelength in the range from ultraviolet region to visible light region is selected, typically, light having a wavelength in the range from 250 nm to 700 nm can be used. As a typical example of the laser beam 180, a solid-state laser typified by a YAG laser or a $YVO_4$ laser, or an excimer laser (XeCl (308 nm), KrF (248 nm) is used. In the case of using the solid-state laser, a second harmonic (532 nm), a third harmonic (355 nm), or a fourth harmonic (266 nm) is used. As the laser that emits the laser beam 180, a continuous wave laser, a quasi continuous wave laser, or a pulsed laser can be used. It is preferable to use a pulsed laser for partial melting. For example, the following lasers can be used: a pulsed laser which can emit a laser beam having a repetition rate of less than or equal to 1 MHz and a pulse width of greater than or equal to 10 nanosecond and less than or equal to 500 nanosecond and a XeCl excimer laser which can emit a laser beam having a repetition rate of 10 Hz to 300 Hz, a pulse width of 25 nanosecond, and a wavelength of 308 nm.

Further, the energy of the laser beam for irradiation of the single-crystal semiconductor layer is determined based on the wavelength of the laser beam, the skin depth of the laser beam and the thickness of the single-crystal semiconductor layer as the object to be treated. The energy of the laser beam can be, for example, in the range of from 300 $mJ/cm^2$ to 800 $mJ/cm^2$. For example, the energy density of the laser beam can be from 600 $mJ/cm^2$ to 700 $mJ/cm^2$ in the case where the thickness of the single-crystal semiconductor layer is about 120 nm, a pulsed laser is used as the laser, and a wavelength of the laser beam is 308 nm.

Irradiation with the laser beam 180 is preferably performed in an inert atmosphere such as a rare gas atmosphere or a nitrogen atmosphere or in a vacuum state. By irradiation with the laser beam 180 in inert atmosphere or vacuum state, generation of cracks in the single-crystal semiconductor layer as the objected to be treated can be suppressed more than the irradiation with a laser beam in an atmospheric atmosphere. For example, when irradiation with the laser beam 180 is conducted in an inert atmosphere, the atmosphere of an airtight chamber is controlled to be an inert atmosphere for irradiation with the laser beam 180. When the chamber is not used, by blowing an inert gas such as a nitrogen gas to the surface irradiated with the laser beam 180 (the surface of the first impurity semiconductor layer 122n+ in FIG. 17), irradiation with the laser beam 180 in the inert atmosphere can be realized.

The laser beam 180 preferably has its cross section shaped into a linear form with homogenous energy distribution through an optical system. By adjusting the laser beam 180 with use of an optical system, uniform irradiation with the laser beam 180 can be conducted with high throughput. The beam length of the laser beam 180 is made longer than one side of the base substrate 110, whereby all of the single-crystal semiconductor layers (or the first impurity semiconductor layers 122n+ that are single-crystal semiconductor layers) can be irradiated with the laser beam 180 at one scanning. In the case where the beam length of the laser beam 180 is shorter than one side of the base substrate 110, the beam length may be made to be long enough that all the single-crystal semiconductor layers bonded to the base substrate 110 can be irradiated with the laser beam 180, by performing scanning a plurality of times.

The crystallinity of the single-crystal semiconductor layers formed being sliced from the single-crystal semiconductor substrate is reduced due to the formation of an embrittlement layer or separation of the single-crystal semiconductor substrate. Thus, by the laser irradiation as described above, the crystallinity of the single-crystal semiconductor layers can be recovered. Because the single-crystal semiconductor layers constitute part of the photoelectric conversion layer, the photoelectric conversion efficiency can be improved by the improvement in the crystallinity. Further, the single-crystal semiconductor layer can function as a seed layer in epitaxial growth, and thus the crystallinity of the semiconductor layer formed by the epitaxial growth can be improved by the improvement in the crystallinity of the single-crystal semiconductor layer. In addition, in this example, the single-crystal semiconductor layer sliced from the single-crystal semiconductor substrate forms the first impurity semiconductor layer 122n+, and laser irradiation can also activate the first impurity semiconductor layer 122n+.

Moreover, heat treatment is conducted instead of the laser processing, or with combination with the laser processing, which can lead to crystallinity recovery or damage repairing. The heat treatment is preferably conducted at higher temperature of a longer time by using a heating furnace or RTA than a heat treatment for separating the single-crystal semiconductor substrate 101 with the embrittlement layer 105 as a boundary. Needless to say, the heat treatment is conducted at a temperature that is not above the strain point of the base substrate 110.

After that, the photoelectric conversion device and the photoelectric conversion device module can be manufactured through the manufacturing process illustrated in FIG. 5A to FIG. 7B.

Note that this embodiment can be combined with any of the other embodiments as appropriate.

Embodiment 7

In this embodiment, an example of a method of manufacturing a photoelectric conversion device and a photoelectric conversion device module, which are different from that in the above embodiment, will be described. Note that description for the same parts as those of the above embodiment is omitted or partly simplified.

Figure 18A:
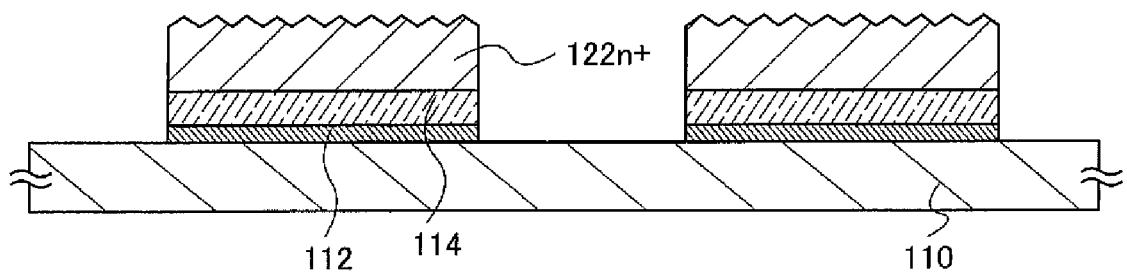
FIGS. 18A and 18B are cross-sectional views illustrating a manufacturing method of another embodiment of a photoelectric conversion device module.

Single-crystal semiconductor layers which have been formed by being sliced from the single-crystal semiconductor substrates are arranged over the base substrate with a predetermined interval therebetween. In an example of this embodiment, as illustrated in FIG. 18A, a first impurity semiconductor layers 122n+ that are formed by being sliced from the single-crystal semiconductor substrate 101 and are arranged over the base substrate 110 with a predetermined interval therebetween are formed. The single-crystal semiconductor layers formed by being sliced from the single-crystal semiconductor substrates correspond to the first impurity semiconductor layers 122n. The steps including and up to this point can be conducted though the manufacturing process illustrated in FIG. 3A to FIG. 4B.

Figure 18B:
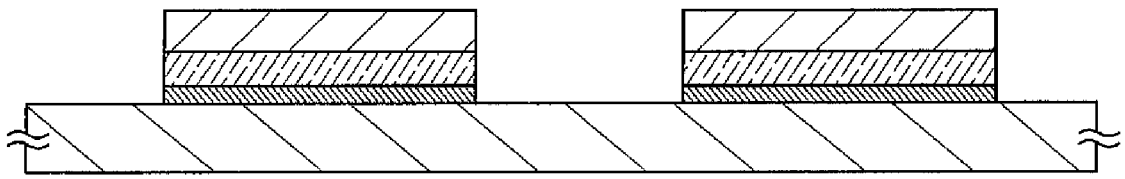

Next, the single semiconductor layers arranged over the base substrate are etched from the superficial surface to be thin. In this embodiment, as illustrated in FIG. 18B, the first impurity semiconductor layers 122n+ that are single-crystal semiconductor layers are etched from the surface side to be thin.

By etching the single-crystal semiconductor layer sliced from the single-crystal semiconductor substrate from the superficial surface, damaged portions due to the formation of the embrittlement layer or separation of the single-crystal semiconductor substrate can be removed. The single-crystal semiconductor layer constitutes part of the photoelectric conversion layer, and thus a damaged portion in the single-crystal semiconductor layer might become a recombination center of carriers, which leads to reduction of the photoelectric conversion efficiency. Thus, by conducting such a step of removing the damaged portion as in this embodiment, a defect that might become a recombination center can be reduced. As a result, the lifetime of carriers can be increased and the photoelectric conversion efficiency can be improved. Here, the first impurity semiconductor layer 122n+ is etched from its superficial surface, thereby removing damaged portions due to the formation of the embrittlement layer or separation of the single-crystal semiconductor substrate.

The thickness by which the single-crystal semiconductor layer is thinned (the thickness of the etched layer) can be set by a person who carries out this invention as appropriate. For example, the single-crystal semiconductor substrate is sliced to form a single-crystal semiconductor layer having a thickness of about 300 nm, and then a portion with a thickness of about 200 nm of the single-crystal semiconductor layer is etched from its superficial surface, whereby an about 100-nm-thick single-crystal semiconductor layer whose damaged portion is removed.

The thinning of the single-crystal semiconductor layer (here the first impurity semiconductor layer 122n+) can be conducted by dry etching or wet etching, preferably dry etching can be applied.

For example, the dry etching may be performed by a dry etching method, for example, an RIE (reactive ion etching) method, an ICP (inductively coupled plasma) etching method, an ECR (electron cyclotron resonance) etching method, a parallel plate (capacitive coupled plasma) etching method, a magnetron plasma etching method, a dual-frequency plasma etching method, a helicon wave plasma etching method, or the like. As the etching gas, for example, a chlorine-based gas such as chlorine, boron chloride, or silicon chloride (including silicon tetrachloride), a fluorine-based gas such as trifluoromethane, carbon fluoride, nitrogen fluoride, or sulfur fluoride, a bromide-based gas such as hydrogen bromide, or the like can be given. Additionally, an inert gas such as helium, argon or xenon, an oxygen gas, a hydrogen gas or the like can be given.

Note that as illustrated in FIG. 18B, after the single-crystal semiconductor is thinned, the single-crystal semiconductor layer is irradiated with a laser beam so that crystallinity of the single-crystal semiconductor layer can be improved. For example, laser processing described in Embodiment 6 can be applied.

After that, the photoelectric conversion device module can be manufactured through the manufacturing process illustrated in FIG. 5A to FIG. 7B.

In this embodiment, the example of forming the first impurity semiconductor layer by slicing the n+ type single-crystal semiconductor substrate is described; but as a matter of fact, the content of this embodiment can be applied to Embodiment 2. In that case, the single-crystal semiconductor layer including the first impurity region is etched from the superficial layer to be thinned.

Note that this embodiment can be combined with any of the other embodiments as appropriate.

Embodiment 8

In this embodiment, an example of a method of manufacturing a photoelectric conversion device and a photoelectric conversion device module, which are different from that in the above embodiment, will be described. Note that description for the same parts as those of the above embodiment is omitted or partly simplified.

Figure 19:
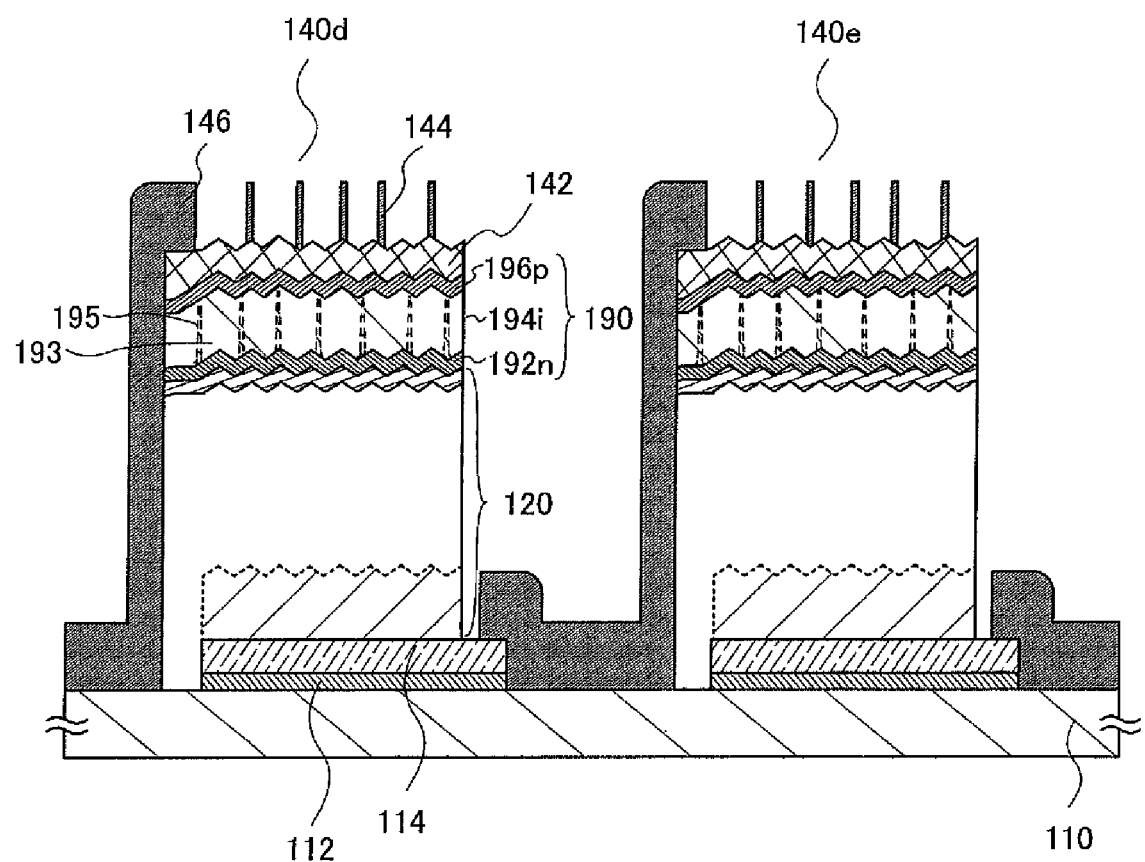
FIG. 19 is a cross-sectional view illustrating another embodiment of a photoelectric conversion device module.

In a photoelectric conversion device module illustrated in FIG. 19, the first electrode 114 is provided over the base substrate 110 with the insulating layer 112 therebetween, and the first unit cell 120 is provided over the first electrode, the second unit cell 190 is provided over the first unit cell 120, and the second electrode 142 and the auxiliary electrode 144 is provided over the second unit cell 190. The top view of the photoelectric conversion device module illustrated in FIG. 19 corresponds to FIG. 1. FIG. 19 illustrates a cross section taken along the section line X-Y in the top view of FIG. 1, where the photoelectric conversion cells 140d and 140e are illustrated.

As one feature of this embodiment, in a non-single-crystal semiconductor layer 194i constituting part of the second unit cell 190, crystals 195 are dispersed in an amorphous region 193. Specifically, the second unit cell 190 includes a stacked structure of a third impurity semiconductor layer 192n of the first conductivity type, the non-single-crystal semiconductor layer 194i including crystals 195 in the amorphous region 193, and a fourth impurity semiconductor layer 196p of the second conductivity type opposite to that of the third impurity semiconductor layer 192n. The conductivity of the third impurity semiconductor layer 192n of the second unit cell 190 is determined such that a pn junction can be formed at the bonding interface with the first unit cell 120.

The formation of the second unit cell 190 according to this embodiment first includes formation of the third impurity semiconductor layer 192n of an n-type micro crystal semiconductor (typically, micro crystal silicon).

Next, a reaction gas whose flow rate of a dilution gas (typically, hydrogen) to a semiconductor source gas (typically silane) is adjusted to a predetermined rate is introduced in a reaction chamber to generate plasma, and the non-single-crystal semiconductor layer 194i is formed over the third impurity semiconductor layer 192n by a plasma CVD method. A semiconductor layer is formed over the micro crystal semiconductor layer with a reaction gas with controlled dilution ratio, and thus the micro crystal semiconductor layer serves as a seed layer, so that the non-single-crystal semiconductor layer 194i including the amorphous region 193 and the crystals 195 can be formed. The structure of the non-single-crystal semiconductor layer 194i is controlled by a structure of the micro crystal semiconductor layer serving as a seed layer or the dilution ratio of the reaction gas. For example, when a film is formed with a relatively high flow rate of a dilution gas to a semiconductor source gas, growth of the crystal region proceeds dominantly. On the other hand, when a film is formed with a relatively low flow rate of a dilution gas to a semiconductor source gas, growth of the amorphous region proceeds dominantly.

The second unit cell 190 is formed by forming the p-type fourth impurity semiconductor layer 196p over the non-single-crystal semiconductor layer 194i.

As an example of formation of the non-single-crystal semiconductor layer 194i, the flow rate of hydrogen is 1 time or more times and less than 10 times, preferably 1 time or more times and less than 6 times, as high as the flow rate of silane, and the reaction gas is introduced into a reaction chamber of a plasma CVD apparatus to generate plasma so that the semiconductor layer is formed. At this time, the non-single-crystal semiconductor layer 194i in which crystals 195 are dispersed in the amorphous region 193 in the direction of film-formation is formed.

The non-single-crystal semiconductor layer 194i preferably includes needle-like crystals 195 in the amorphous region 193. Here, the needle-like shape includes a conical shape, a pyramidal shape, and a pillar-like shape. Specifically, as the pillar-like shape, a cylindrical shape and a prismatic columnar shape are given. As the pyramidal shape, a triangular pyramidal shape, a quadrangular pyramidal shape, a hexagonal pyramidal shape, and the like are given. As the prismatic columnar shape, a triangular prism, a quadrangular prism, a hexagonal prism, and the like are given. Alternatively, another polygonal pyramidal shape or another prism can be used. Further alternatively, a conical or pyramidal shape with a pointed vertex or a cylindrical or prismatic columnar shape with a sharp edge may be used. In the case of a polygonal pyramidal shape or a polygonal prism shape, each side may be equal to or different from each other in length. In this specification, the crystal with such a shape is also referred to as a needle-like crystal. Further, the crystal 195 that a needle-like crystal can successively exist between the third impurity semiconductor layer 192n and the fourth impurity semiconductor layer 196p. In other words, the crystal 195 grows penetrating the non-single-crystal semiconductor layer 194i. In this specification, such a crystal that successively exists is also called a penetrating needle-like crystal (PNC). Note that the crystal 195 does not necessarily penetrate the non-single-crystal semiconductor layer 194i.

In addition, the crystals 195 include a crystal semiconductor (typically, crystalline silicon) such as a micro crystal semiconductor, a polycrystal semiconductor, or a single-crystal semiconductor. The amorphous region 193 is formed from an amorphous semiconductor (typically amorphous silicon). The amorphous semiconductor typified by amorphous silicon is direct-transition type and has a high light-absorption coefficient. Thus, in the non-single-crystal semiconductor layer 194i where the crystals 195 exist in the amorphous region 193, the amorphous region 193 generates more photogenerated carriers dominantly than the crystals 195. While the amorphous region formed from amorphous silicon has a band gap of from 1.6 eV to 1.8 eV, a crystal region formed from crystalline silicon has a band gap of from about 1.1 eV to 1.4 eV. Because of the relationship of the band gap, the photogenerated carriers in the non-single-crystal semiconductor layer 194i including the crystals 195 in the amorphous region 193 move to the crystals 195 by diffusion or drift. The crystals 195 function as a conduction path (carrier path) of photogenerated carriers. With this structure, because photogenerated carriers moves dominantly in the crystals 195 even if photoinduced defects are generated, the probability that photogenerated carriers will be trapped by defect levels of the non-single-crystal semiconductor layer 194i is decreased. Further, the crystals 195 grow so as to penetrate the interface between the third impurity semiconductor layer 192n and the fourth impurity semiconductor layer 196p, electrons and holes that are photogenerated carriers are easy to move because of the low probability of being trapped. Accordingly, change of characteristics due to light deterioration which has been a problem can be reduced. In other words, the characteristics of the top cell are prevented from being changed due to light deterioration, and the bottom cell is formed using a single-crystal semiconductor layer, whereby excellent photoelectric conversion characteristics can be realized.

With the use of the non-single-crystal semiconductor layer 194i in which the crystals 195 exist in the amorphous region 193, the layer can have regions divided for functions: for example, a region where photoelectric conversion is mainly performed by producing photogenerated carriers and a region which mainly serve as a carrier path for the produced photogenerated carriers. In an amorphous or micro crystal semiconductor layer for forming a conventional photoelectric conversion layer, photoelectric conversion and a carrier path are conducted without being divided from each other and when one function is put in priority to the other function, the other is degraded in some cases. However, by the use of regions divided for functions as above, the both functions can be improved and the photoelectric conversion characteristics can be improved.

Owing to the non-single-crystal semiconductor layer 194i including the crystals 195 in the amorphous region 193, the light absorption coefficient can be maintained by the amorphous region 193. Accordingly, the thickness of the photoelectric conversion layer including the non-single-crystal semiconductor layer 194i can be the same or substantially the same as the photoelectric conversion layer including an amorphous silicon thin film and the productivity can be improved as compared with a photoelectric conversion device including a micro crystal silicon thin film.

Note that this embodiment can be combined with any of the other embodiments as appropriate.

This application is based on Japanese Patent Application serial no. 2008-166681 filed with Japan Patent Office on Jun. 26, 2008, the entire contents of which are hereby incorporated by reference.

What is claimed is:

1. A method for manufacturing a photoelectric conversion device module, comprising:
    preparing a plurality of single-crystal semiconductor substrates, wherein each of the plurality of single-crystal semiconductor substrates is provided with a first electrode and an insulating layer over one surface thereof and an embrittlement layer therein;
    attaching the plurality of single-crystal semiconductor substrates to a base substrate with the first electrode and the insulating layer therebetween so that the insulating layer and the base substrate are bonded, wherein the plurality of single-crystal semiconductor substrates are arranged over the base substrate with an interval therebetween;
    separating each of the plurality of single-crystal semiconductor substrates at the embrittlement layer as a boundary, whereby a plurality of stacked bodies in which the insulating layer, the first electrode and a first single-crystal semiconductor layer having a first conductivity type are stacked sequentially are formed over the base substrate;
    forming a second single-crystal semiconductor layer over the plurality of stacked bodies so as to cover the plurality of stacked bodies and a space between the plurality of stacked bodies adjacent to each other;
    forming a second impurity semiconductor layer having a second conductivity type opposite to the first conductivity type over the second single-crystal semiconductor layer so that a first photoelectric conversion layer in which the first single-crystal semiconductor layer, the second single-crystal semiconductor layer and the second impurity semiconductor layer are stacked is formed;
    forming a second photoelectric conversion layer comprising a non-single-crystal semiconductor layer over the first photoelectric conversion layer;
    forming a second electrode over the second photoelectric conversion layer;
    selectively etching the second electrode, the second photoelectric conversion layer and the first photoelectric conversion layer at the space between the plurality of stacked bodies adjacent to each other to partially expose the first electrode of each of the plurality of stacked bodies, whereby a plurality of photoelectric conversion cells are arranged over the base substrate with an interval therebetween; and
    forming a plurality of connecting electrodes wherein each of the plurality of connecting electrodes connects two of the plurality of photoelectric conversion cells adjacent to each other and is in contact with an upper surface of the second electrode of one of the two of the plurality of photoelectric conversion cells and an exposed upper surface of the first electrode of the other of the two of the plurality of photoelectric conversion cells.

2. The method according to claim 1,
    wherein the second single-crystal semiconductor layer is single-crystallized.

3. The method according to claim 1,
    wherein the second single-crystal semiconductor layer is formed by heat treatment after the non-single-crystal semiconductor layer is formed.

4. The method according to claim 1,
    wherein the second single-crystal semiconductor layer includes a semiconductor film formed by a plasma CVD method.

5. The method according to claim 1,
    wherein the embrittlement layer is formed by introducing hydrogen, helium or halogen into the inside of each of the plurality of single-crystal semiconductor substrates.

6. The method according to claim 1,
    wherein the embrittlement layer is formed by scanning with a laser beam that allows multiphoton absorption, while a focal point of the laser beam is focused inside each of the plurality of single-crystal semiconductor substrates.

7. The method according to claim 1,
    wherein the base substrate is a glass substrate.

8. The method according to claim 1,
    wherein the first conductivity type is an n-type, and the second conductivity type is a p-type.

9. The method according to claim 1,
    wherein the second photoelectric conversion layer is formed by stacking a third impurity semiconductor layer having the first conductivity type, the non-single-crystal semiconductor layer and a fourth impurity semiconductor layer having the second conductivity type sequentially over the first photoelectric conversion layer.

10. A method for manufacturing a photoelectric conversion device module, comprising:

preparing a plurality of single-crystal semiconductor substrates, wherein each of the plurality of single-crystal semiconductor substrates has a first electrode over one surface thereof and an embrittlement layer therein;

attaching the plurality of single-crystal semiconductor substrates to a base substrate provided with an insulating layer with the first electrode therebetween, and bonding the insulating layer and the first electrode by ultrasonic wave bonding, wherein the plurality of single-crystal semiconductor substrates are arranged over the base substrate with an interval therebetween;

separating each of the plurality of single-crystal semiconductor substrates at the embrittlement layer as a boundary, whereby a plurality of stacked bodies in which the first electrode and a first single-crystal semiconductor layer having a first conductivity type are stacked sequentially are formed over the base substrate provided with the insulating layer;

forming a second single-crystal semiconductor layer over the plurality of stacked bodies so as to cover the plurality of stacked bodies and a space between the plurality of stacked bodies adjacent to each other;

forming a second impurity semiconductor layer having a second conductivity type opposite to the first conductivity type over the second single-crystal semiconductor layer so that a first photoelectric conversion layer in which the first single-crystal semiconductor layer, the second single-crystal semiconductor layer and the second impurity semiconductor layer are stacked is formed;

forming a second photoelectric conversion layer comprising a non-single-crystal semiconductor layer over the first photoelectric conversion layer;

forming a second electrode over the second photoelectric conversion layer;

selectively etching the second electrode, the second photoelectric conversion layer and the first photoelectric conversion layer at the space between the plurality of stacked bodies adjacent to each other to partially expose the first electrode of each of the plurality of stacked bodies, whereby a plurality of photoelectric conversion cells are arranged over the base substrate with an interval therebetween; and forming a plurality of connecting electrodes wherein each of the plurality of connecting electrodes connects two of the plurality of photoelectric conversion cells adjacent to each other and is in contact with an upper surface of the second electrode of one of the two of the plurality of photoelectric conversion cells and an exposed upper surface of the first electrode of the other of the two of the plurality of photoelectric conversion cells.

11. The method according to claim 10,
wherein the first electrode includes aluminum, and
wherein the insulating layer includes a silicon nitride layer, a silicon nitride oxide layer, or a silicon oxynitride layer.

12. The method according to claim 10,
wherein the second single-crystal semiconductor layer is single-crystallized.

13. The method according to claim 10,
wherein the second single-crystal semiconductor layer is formed by heat treatment after the non-single-crystal semiconductor layer is formed.

14. The method according to claim 10,
wherein the second single-crystal semiconductor layer includes a semiconductor film formed by a plasma CVD method.

15. The method according to claim 10,
wherein the embrittlement layer is formed by introducing hydrogen, helium or halogen into the inside of each of the plurality of single-crystal semiconductor substrates.

16. The method according to claim 10,
wherein the embrittlement layer is formed by scanning with a laser beam that allows multiphoton absorption, while a focal point of the laser beam is focused inside each of the plurality of single-crystal semiconductor substrates.

17. The method according to claim 10,
wherein the base substrate is a glass substrate.

18. The method according to claim 10,
wherein the first conductivity type is an n-type, and the second conductivity type is a p-type.

19. The method according to claim 10,
wherein the second photoelectric conversion layer is formed by stacking a third impurity semiconductor layer having the first conductivity type, the non-single-crystal semiconductor layer and a fourth impurity semiconductor layer having the second conductivity type sequentially over the first photoelectric conversion layer.

* * * * *